(12) United States Patent
Shin

(10) Patent No.: US 8,542,527 B2
(45) Date of Patent: Sep. 24, 2013

(54) MAGNETIC MEMORY CELL

(75) Inventor: Hyungsoon Shin, Seoul (KR)

(73) Assignee: EWHA University-Industry Collaboration Foundation, Seoul (KR)

( * ) Notice: Subject to any disclaimer, the term of this patent is extended or adjusted under 35 U.S.C. 154(b) by 0 days.

(21) Appl. No.: 12/513,035

(22) PCT Filed: Mar. 6, 2008

(86) PCT No.: PCT/KR2008/001276
§ 371 (c)(1),
(2), (4) Date: Apr. 30, 2009

(87) PCT Pub. No.: WO2009/011484
PCT Pub. Date: Jan. 22, 2009

(65) Prior Publication Data
US 2010/0103730 A1      Apr. 29, 2010

(30) Foreign Application Priority Data
Jul. 13, 2007  (KR) .......................... 10-2007-0070472

(51) Int. Cl.
G11C 11/15       (2006.01)
G11C 7/00        (2006.01)
(52) U.S. Cl.
USPC ...... 365/173; 365/189.08; 365/158; 365/148; 365/171
(58) Field of Classification Search
USPC ...................... 365/158, 173, 189.08, 148, 171
See application file for complete search history.

(56) References Cited

U.S. PATENT DOCUMENTS

| 5,894,447 | A | 4/1999 | Takashima |
| 6,667,899 | B1 * | 12/2003 | Subramanian et al. ....... 365/158 |
| 7,170,775 | B2 * | 1/2007 | Lin et al. ...................... 365/158 |
| 7,652,398 | B2 * | 1/2010 | Koch et al. ................... 307/407 |

(Continued)

FOREIGN PATENT DOCUMENTS

| KR | 1020030002259 | 1/2003 |
| KR | 1020040021389 | 3/2004 |

OTHER PUBLICATIONS

Zhao et al , "Integration of Spin-RAM technology in FPGA circuits" (pp. 799-802) published by Solid State and Integrated Circuit Technology, 2006 (ICSICT 2006). 8th International Conference. Date: Oct. 23-26, 2006.*

Meng, Hao et al., "A Spintronics Full Adder for Magnetic CPU," *IEEE Electron Device Letters*, vol. 26(6):360-362 (2005).

*Primary Examiner* — Toan Le
*Assistant Examiner* — Hai Pham
(74) *Attorney, Agent, or Firm* — Nelson Mullins Riley & Scarborough LLP; John S. Curran

(57) ABSTRACT

The present invention relates to a magnetic memory cell, which controls the magnetization direction of the free magnetic layer of a Magnetic Tunnel Junction (MTJ) device using a spin torque transfer, and enables the implementation of a magnetic logic circuit, in which memory and logic circuit functions are integrated. The magnetic memory cell includes an MTJ device (10) including a top electrode (11) and a bottom electrode (13), which are provided to allow current to flow therethrough, and a fixed layer (15) and a free layer (17), which are magnetic layers respectively deposited on a top and a bottom of an insulating layer (19), required to insulate the top and bottom electrodes from each other. A current control circuit (50) controls a flow of current flowing between the top and bottom electrodes, and changes a magnetization direction of the free layer according to an input logic level.

13 Claims, 12 Drawing Sheets

(56) References Cited

U.S. PATENT DOCUMENTS

| | | | |
|---|---|---|---|
| 7,755,930 B2 * | 7/2010 | Kim et al. | 365/158 |
| 2005/0099724 A1 | 5/2005 | Nakamura et al. | |
| 2006/0083054 A1 | 4/2006 | Jeong | |
| 2006/0092698 A1 | 5/2006 | Jeong et al. | |
| 2006/0098480 A1 | 5/2006 | Bessho | |
| 2008/0094888 A1 | 4/2008 | Chen et al. | |
| 2008/0247072 A1 | 10/2008 | Nozieres et al. | |
| 2009/0067231 A1 | 3/2009 | Mani | |

* cited by examiner

Prior Art

FIG. 9
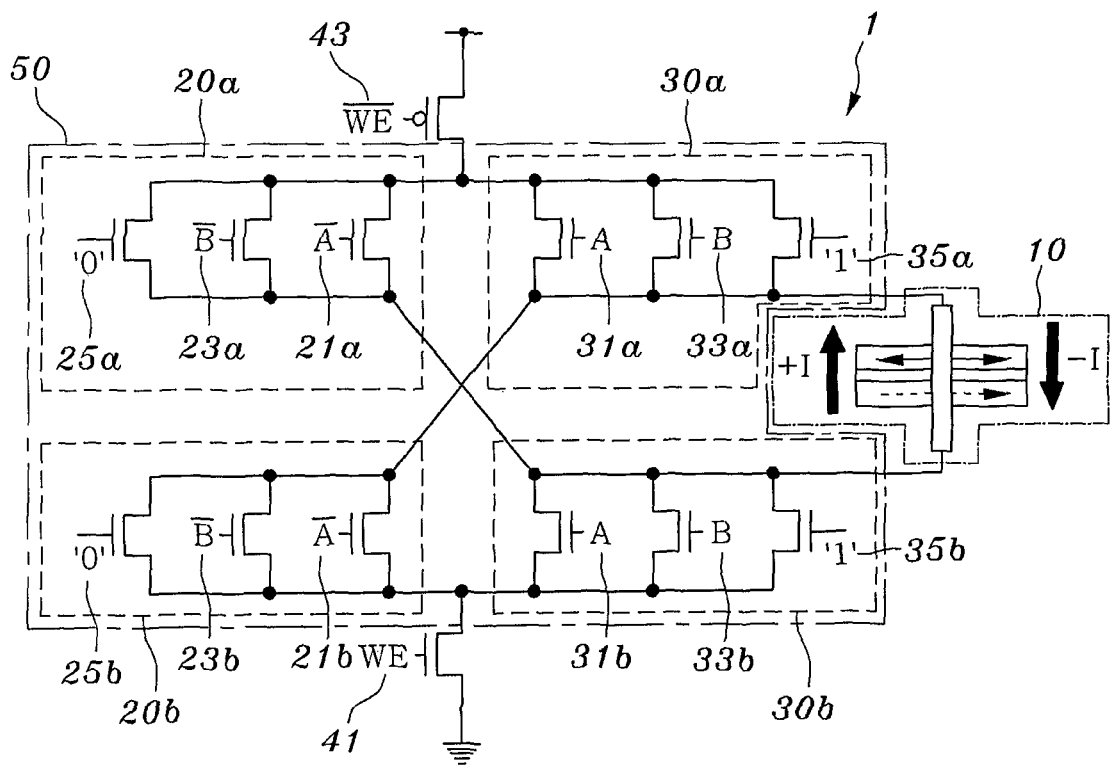
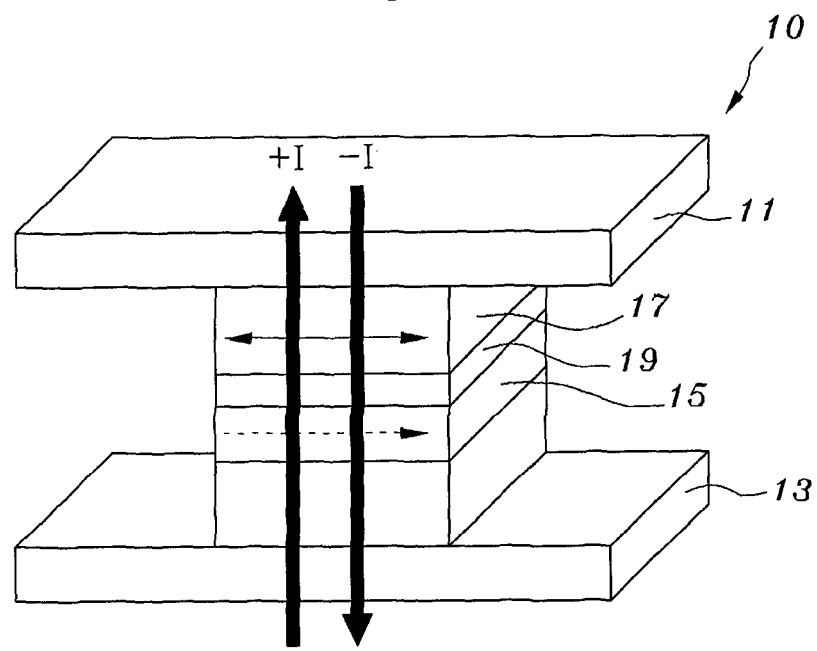

MAGNETIC MEMORY CELL

Related Applications

This application is a 35 U.S.C. §371 national stage filing of PCT Application No. PCT/KR2008/001276 filed on Mar. 6, 2008, which claims priority to, and the benefit of, Korean Patent Application No. 10-2007-0070472 filed on Jul. 13, 2007. The contents of the aforementioned applications are hereby incorporated by reference.

TECHNICAL FIELD

The present invention relates, in general, to the configuration of a logic circuit using a magnetic memory cell, and, more particularly, to a magnetic memory cell, which controls the magnetization direction of the free magnetic layer of a Magnetic Tunnel Junction (MTJ) device using a spin torque transfer, and enables the implementation of a magnetic logic circuit, in which memory and logic circuit functions are integrated, using the magnetization direction.

BACKGROUND ART

Generally, a logic circuit using a magnetic tunnel junction is operated such that, when the same current flows through an input terminal, the magnetization direction of a free magnetic layer is changed, whereas when the directions of currents are different from each other, the magnetization direction of the free magnetic layer is not changed. Accordingly, the magnetic spin of the free magnetic layers within intersecting cells can be arranged in desired directions due to a combined magnetic field formed by respective currents, while the magnetization direction of a pinned magnetic layer is fixed. As a result, two types, that is, parallel and anti-parallel directions, are implemented as the magnetization directions of the two magnetic layers, so that a digital signal having logic levels '1' and '0' can be recorded.

Further, when a digital signal having logic levels '1' and '0' is read, the Tunneling Magneto-Resistance (TMR) of an MTJ device is used. When a detection voltage is applied to the MTJ device, electron carriers are tunneled through a non-magnetic and non-conductive tunneling layer between the magnetic layers, thus passing through the magnetic layers. Resistance relative to the detection current is maximized when the magnetic vectors of the pair of magnetic layers are parallel in opposite directions (anti-parallel), and is minimized when the magnetic vectors of the magnetic layers are parallel in the same direction (parallel), thus enabling resistance corresponding to the relative magnetization directions of the two magnetic layers to be measured on the basis of the conductance of electrons, which tunnel through the insulating layer.

FIG. 1 is a perspective view schematically showing a conventional Magnetic Tunnel Junction (MTJ) device. As shown in the drawing, a conventional MTJ device 100 (disclosed in IEEE Electron Device Letters, vol. 26, no. 6, p. 360, 2005) includes a top electrode 111 and a bottom electrode 113, which are provided to allow current to flow therethrough, a pinned magnetic layer 115 and a free magnetic layer 117, which are magnetic layers deposited between the top electrode 111 and the bottom electrode 113, and an insulating layer 119 deposited between the pinned magnetic layer 115 and the free magnetic layer 117 to insulate them from each other.

Further, the MTJ device includes three or more input layers 120 disposed on the top of the top electrode 111 and configured to receive current to magnetize both the pinned magnetic layer 115 and the free magnetic layer 117 of the MTJ 110, thus performing a logic operation depending on logic levels input through the input layers 120.

Further, the pinned magnetic layer 115 is pinned to prevent the magnetization direction from being changed depending on the input of respective input layers 121, 123 and 125. When the number of currents flowing in the same direction, among currents flowing through the first input layer 121, the second input layer 123 and the third input layer 125, is two or more, the magnetization direction of the free magnetic layer 117 is determined by the direction of the currents.

TABLE 1

| A | B | C | R |
|---|---|---|---|
| −I (0) | −I (0) | −I (0) | $R_L$ (0) |
| −I (0) | −I (0) | +I (0) | $R_L$ (0) |
| −I (0) | +I (0) | −I (0) | $R_L$ (0) |
| +I (0) | −I (0) | −I (0) | $R_L$ (0) |
| −I (0) | +I (0) | +I (0) | $R_H$ (1) |
| +I (0) | −I (0) | +I (0) | $R_H$ (1) |
| +I (0) | +I (0) | −I (0) | $R_H$ (1) |
| +I (0) | +I (0) | +I (0) | $R_H$ (1) |

In this case, A, B, and C respectively indicate the directions of currents flowing through the first input layer 121, the second input layer 123, and the third input layer 125, and R indicates the magnetic resistance of the MTJ device 100.

Further, referring to Table 1, when the number of identical inputs, among inputs A, B and C, is two or more, the magnetization direction of the free magnetic layer 117 is changed depending on the direction of the currents, and thus the value of the magnetic resistance is determined according to the magnetization direction.

For example, when the number of input currents corresponding to −I(0), among input currents A, B and C, is two or more, the free magnetic layer 117 is magnetized in the right direction, and the pinned magnetic layer 115 is pinned to the right direction, and thus the magnetic resistance is $R_L$(0). When the number of currents corresponding to +I1 is two or more, the free magnetic layer 117 is magnetized in the left direction, and the pinned magnetic layer 115 is pinned to the right direction, and thus the magnetic resistance is $R_H$ (1).

In Table 1, the MTJ device 100 can drive the logic circuit given in the following Equation 1.

$$R = A \cdot B + B \cdot C + C \cdot A \quad \text{[Equation 1]}$$

However, there are problems in that, since three metal input layers are provided to change the magnetization direction of the free magnetic layer of the MTJ device, the number of processes increases and the manufacturing costs thereof increase, and in that, since current driving circuits for respective metal input layers are added, the degree of integration attributable to circuits added to the MTJ device decreases, so that it is difficult to minimize the size of logic circuits, and respective metal input layers are spaced apart from the MTJ device, with the result that current required to control a magnetization direction increases, thus increasing power consumption.

DISCLOSURE

Technical Problem

Accordingly, the present invention has been made keeping in mind the above problems occurring in the prior art, and an object of the present invention is to provide a magnetic memory cell, which controls the magnetization direction of a free layer using an MTJ device that uses spin torque transfer, and which enables the implementation of a logic circuit using the magnetization direction.

Another object of the present invention is to provide a magnetic memory cell, which minimizes the size of a magnetic logic circuit and enables various logic circuits to be easily implemented by eliminating circuits and metal input layers added to an MTJ device.

Technical Solution

In order to accomplish the above objects, the present invention provides a magnetic memory cell, comprising a Magnetic Tunnel Junction (MTJ) device including a top electrode and a bottom electrode, which are provided to allow current to flow therethrough, and a fixed layer and a free layer, which are magnetic layers respectively deposited on a top and a bottom of an insulating layer, required to insulate the top and bottom electrodes from each other; and a current control circuit for controlling a flow of current flowing between the top and bottom electrodes, and changing a magnetization direction of the free layer according to an input logic level.

ADVANTAGEOUS EFFECTS

The present invention is advantageous in that the magnetization direction of the free layer of an MTJ device is changed using spin torque transfer, thus enabling additional metal input layers to be eliminated.

Further, the present invention is advantageous in that, as additional metal input layers are eliminated, the number of processes for manufacturing memory cells can be reduced, and the manufacturing costs of memory cells can be decreased.

Further, the present invention is advantageous in that respective metal input layers are eliminated, so that there is no need to provide current control circuits for respective metal input layers, thus increasing the degree of integration of an MTJ device.

In addition, the present invention is advantageous in that the size of a magnetic logic circuit can be minimized, and spin torque transfer can be used, thus reducing power consumption by minimizing current consumption.

DESCRIPTION OF DRAWINGS

FIG. 9 illustrates a circuit diagram and a partially enlarged diagram showing a NOR logic circuit implemented using the magnetic memory cell according to the present invention;

Figure 1:
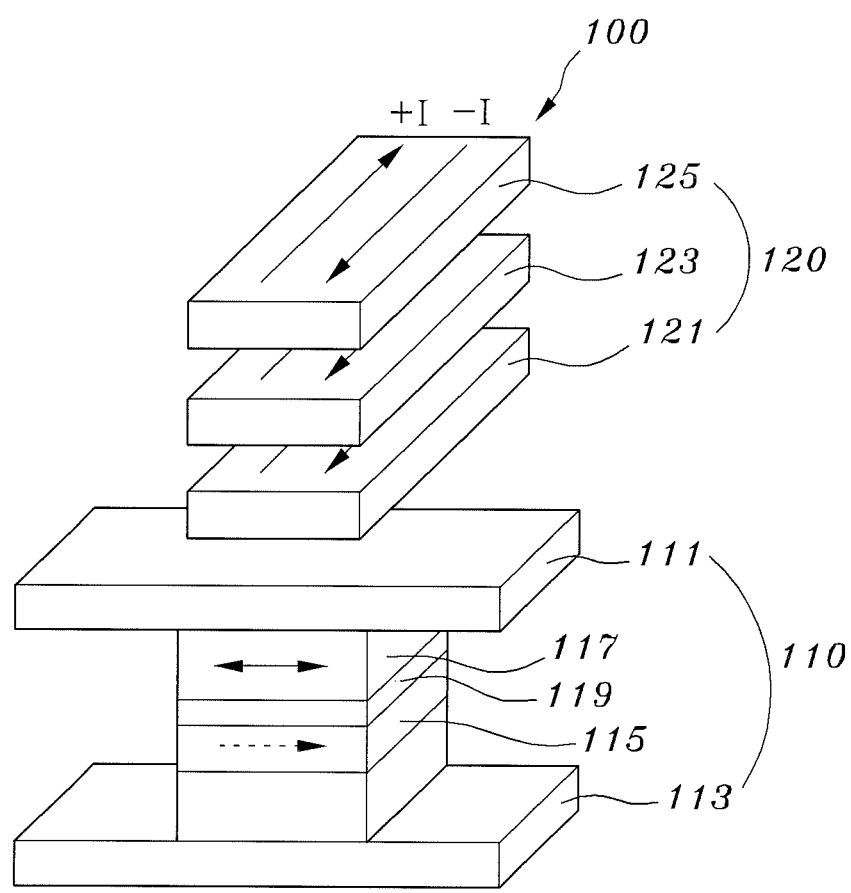
FIG. 1 is a perspective view schematically showing a conventional MTJ device.

<Description of reference characters of important parts>

| | |
|---|---|
| 1: magnetic memory cell | 10: MTJ device |
| 11: top electrode | 13: bottom electrode |
| 15: fixed layer | 17: free layer |
| 19: insulating layer | 20a: second current driving unit |
| 21a: first MOSFET | 23a: second MOSFET |
| 25a: third MOSFET | 20b: fourth current driving unit |
| 21b: first MOSFET | 23b: second MOSFET |
| 25b: third MOSFET | 30a: first current driving unit |
| 31a: first MOSFET | 33a: second MOSFET |
| 35a: third MOSFET | 30b: third current driving unit |
| 31b: first MOSFET | 33b: second MOSFET |
| 35b: third MOSFET | 41: second enable MOSFET |
| 43: first enable MOSFET | 50: current control circuit |

BEST MODE

In order to accomplish the above objects, the present invention provides a magnetic memory cell, comprising a Magnetic Tunnel Junction (MTJ) device including a top electrode and a bottom electrode, which are provided to allow current to flow therethrough, and a fixed layer and a free layer, which are magnetic layers respectively deposited on a top and a bottom of an insulating layer, required to insulate the top and bottom electrodes from each other; and a current control circuit for controlling a flow of current flowing between the top and bottom electrodes, and changing a magnetization direction of the free layer according to an input logic level.

Further, the magnetization direction of the fixed layer may be fixed.

Further, a signal input to the gate of the current control circuit is changed, and thus a logic level is formed.

Furthermore, when current applied to the MTJ device flows from the top electrode to the bottom electrode, the magnetization direction of the free layer is identical to that of the fixed layer.

In this case, when the magnetization directions of the free layer and the fixed layer are identical to each other, the magnetic resistance of the MTJ device has a logic level '0'.

Further, when current applied to the MTJ device flows from the bottom electrode to the top electrode, the magnetization direction of the free layer is opposite that of the fixed layer.

In this case, when the magnetization directions of the free layer and the fixed layer are opposite each other, the magnetic resistance of the MTJ device has a logic level '1'.

Further, the current control circuit comprise a first current driving unit, a source of which is connected to the top electrode; a second current driving unit, a drain of which is connected to the first current driving unit; a third current driving unit, a drain of which is connected to the bottom electrode; and a fourth current driving unit, a source of which is connected to the third current driving unit.

In this case, each of the first to fourth current driving units includes three MOSFETs connected in parallel with each other.

Further, the source of the first current driving unit is connected to the drain of the fourth current driving unit, and a source of the second current driving unit is connected to the drain of the third current driving unit.

Further, the current control circuit comprises a first enable MOSFET, a first end of which is connected to a node to which the first current driving unit and the second current driving unit are connected; and a second enable MOSFET, a first end of which is connected to a node to which the third current driving unit and the fourth current driving unit are connected.

Further, each of the current driving unit comprises a first MOSFET having a gate to which a first logic input signal is applied; a second MOSFET having a gate to which a second logic input signal is applied; and a third MOSFET having a gate to which a third logic input signal is applied.

Further, signals applied to respective gates of the MOSFETs, constituting the first current driving unit, are identical to signals applied to respective gates of the MOSFETs, constituting the third current driving unit, and signals applied to respective gates of the MOSFETs, constituting the second current driving unit, are identical to respective gates of the MOSFETs, constituting the fourth current driving unit, but the signals applied to the first current driving unit and the second current driving unit have an inverted relationship with each other.

Further, the magnetic memory cell is operated as one of an AND circuit, an OR circuit, a NAND circuit and a NOR circuit according to the third logic input signal applied to the gate of a third MOSFET, constituting each of the current driving units.

Further, the magnetic memory cell is operated as the AND circuit according to logic levels of the first logic input signal and the second logic input signal when a logic level of the third logic input signal applied to the first current driving unit is '1'.

Further, the magnetic memory is operated as the OR circuit according to logic levels of the first logic input signal and the second logic input signal when a logic level of the third logic input signal applied to the first current driving unit is '0'.

Further, the magnetic memory cell is operated as the NAND circuit according to logic levels of the first logic input signal and the second logic input signal when signals applied to gates of respective MOSFETs of the first current driving unit are non-inverted signals, and a logic level of the third logic input signal applied to the first current driving unit is '0'.

Furthermore, the magnetic memory cell is operated as the NOR circuit according to logic levels of the first logic input signal and the second logic input signal when signals applied to gates of respective MOSFETs of the first current driving unit are non-inverted signals, and a logic level of the third logic input signal applied to the first current driving unit is '1'.

MODE FOR INVENTION

Hereinafter, embodiments of the present invention will be described in detail with reference to the attached drawings.

Figure 2:
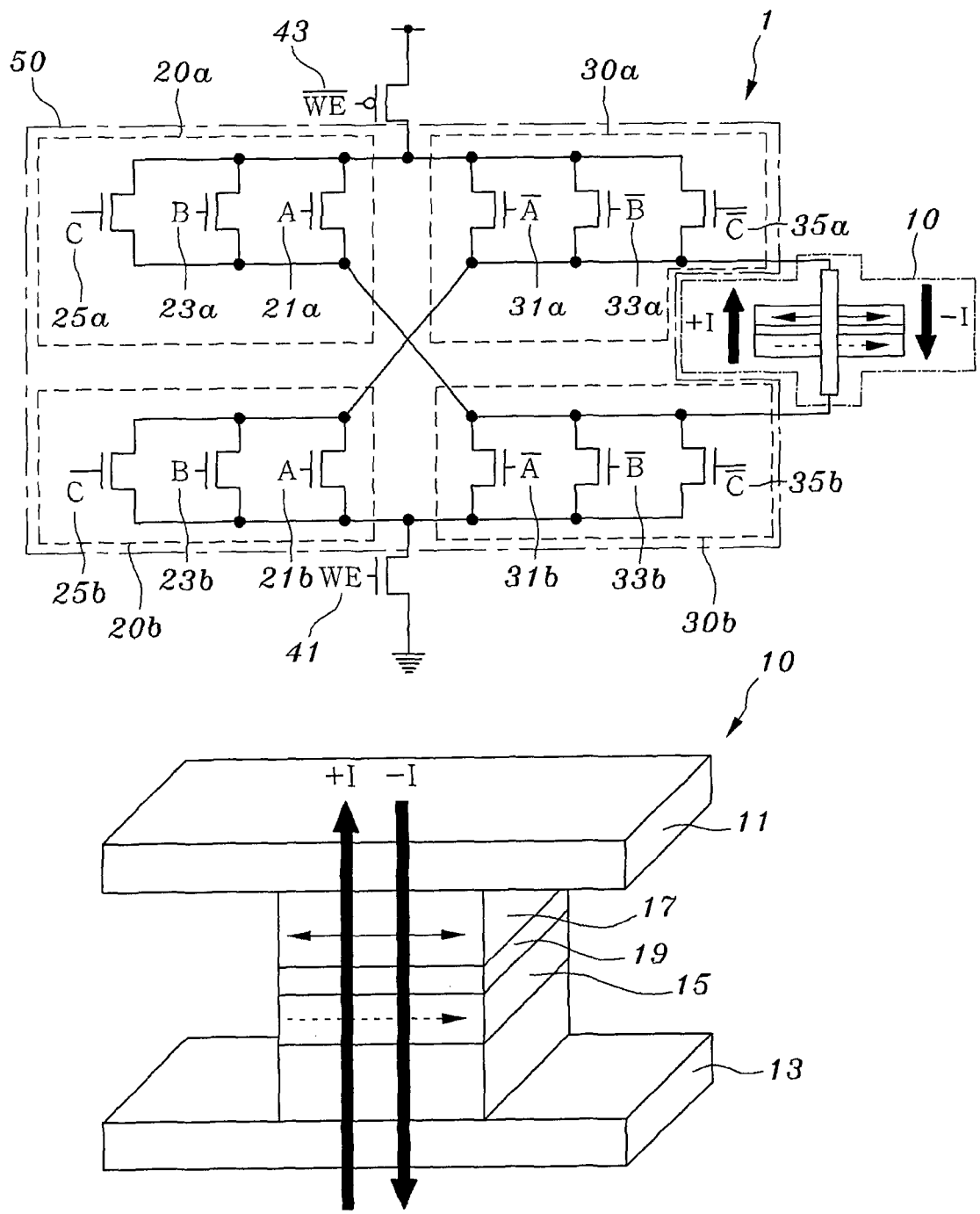
FIG. 2 illustrates a circuit diagram and a partially enlarged diagram schematically showing a magnetic memory cell according to the present invention.

FIG. 2 illustrates a circuit diagram and a partially enlarged diagram schematically showing a magnetic memory cell according to the present invention. As shown in the drawings, a magnetic memory cell 1 according to the present invention includes a Magnetic Tunnel Junction (MTJ) device 10 and a current control circuit 50.

In this case, the MTJ device 10 includes a fixed layer 15 and a free layer 17, which are magnetic layers deposited between a top electrode 11 and a bottom electrode 13, and an insulating layer 19 deposited between the fixed layer 15 and the free layer 17 to insulate them from each other.

Further, the magnetization direction of the fixed layer 15 is fixed to the right direction, and is continuously maintained in the right direction regardless of the direction of current applied by the current control circuit 50.

Here, the MTJ device 10 is a component constituting Magnetoresistive Random Access Memory (MRAM), and is configured to store data and information using a magnetoresistance effect in which the resistance of an electric conductor is changing according to a surrounding magnetic field.

The term 'magnetoresistance effect' means a phenomenon in which the electrical resistance of material is changed due to a magnetic field. When a magnetic field is applied to metal or a semiconductor, electrical resistance thereof increases, and an increase in the electrical resistance is proportional to the square of the intensity of the magnetic field with respect to a weak electric field. The case where the direction of current is perpendicular to the direction of a magnetic field is called a transverse effect. In a ferromagnetic substance, variation in resistance occurs according to variation in the direction of spontaneous magnetization.

Accordingly, in the MTJ device 10, the current control circuit 50 controls the magnetization direction of the free layer 17 by applying current in a vertical direction, and the magnetic resistance of the MTJ device 10 is changed to the changed magnetization direction, and thus data can be recorded in memory, or a logic circuit can be implemented, using the magnetic resistance.

Further, the magnetization direction of the free layer 17 is changed according to the direction of current. When the direction of current applied by the current control circuit 50 is a direction from the top electrode 11 to the bottom electrode 13 of the MTJ device 10, the magnetization direction of the free layer 17 is changed to the direction identical to that of the fixed layer 15. When the direction of current applied by the current control circuit 50 is a direction from the bottom electrode 11 to the top electrode 13 of the MTJ device 10, the magnetization direction of the free layer 17 is changed to a direction opposite that of the fixed layer 15.

Here, when the magnetization directions of the free layer 17 and the fixed layer 15 are parallel in opposite directions (anti-parallel), the magnetic resistance is maximized, and thus a logic level '1' can be output. When the magnetization directions of the free layer 17 and the fixed layer 15 are parallel in the same direction (parallel), the magnetic resistance is minimized, and thus a logic level '0' can be output.

In an embodiment of the present invention, when the direction of current applied by the current control circuit 50 is a top to bottom direction in the case where the magnetization direction of the fixed layer 15 is assumed to be a right direction, the magnetization direction of the free layer 17 is changed to the right direction, so that the magnetization directions of the free layer 17 and the fixed layer 15 are parallel in the same direction, and the magnetic resistance is minimized, and thus a logic level '0' is obtained.

In contrast, when the direction of current applied by the current control circuit 50 is in the bottom to top direction, the magnetization direction of the free layer is changed to a left direction, so that the magnetization directions of the free layer 17 and the fixed layer 15 are anti-parallel with each other, and the magnetic resistance is maximized, and thus a logic level '1' is obtained.

The current control circuit 50 includes a first current driving unit 30a, a second current driving unit 20a, a third current driving unit 30b, a fourth current driving unit 20b, a first enable Metal Oxide Semiconductor Field Effect Transistor (MOSFET), and a second enable MOSFET. Here, the first current driving unit 30a includes a first MOSFET 31a, a second MOSFET 33a and a third MOSFET 35a. One end of the first current driving unit 30a is connected both to the top electrode 11 of the MTJ device 10 and to the fourth current driving unit 20b, and the other end is connected to the second current driving unit 20a.

Further, the first MOSFET 31a, the second MOSFET 33a, and the third MOSFET 35a are preferably implemented as NMOS transistors and are connected in parallel, and the sources thereof are connected both to the top electrode 11 and to the fourth current driving unit 20b.

Further, the second current driving unit 20a includes a first MOSFET 21a, a second MOSFET 23a and a third MOSFET 25a. One end of the second current driving unit 20a is connected to the first current driving unit 30a, and the other end is connected to the third current driving unit 30b.

In this case, the first MOSFET 21a, the second MOSFET 23a, and the third MOSFET 25a are preferably implemented as NMOS transistors, and are connected in parallel with each other. The sources of respective MOSFETs 21a, 23a and 25a are connected to the drain of the third current driving unit 30b, and the drains of the MOSFETs 21a, 23a and 25a are connected to the drains of respective MOSFETs 31a, 33a and 35a of the first current driving unit 30a. Furthermore, the third current driving unit 30b includes a first MOSFET 31b, a second MOSFET 33b, and a third MOSFET 35b. The drains of respective MOSFETs 31b, 33b, and 35b of the third current driving unit 30b are connected both to the bottom electrode 13 of the MTJ device 10 and to the sources of MOSFETs 21a, 23a, and 25a of the second current driving unit 20a.

The first MOSFET 31b, the second MOSFET 33b, and the third MOSFET 35b are preferably implemented as NMOS transistors, and are connected in parallel with each other. The sources of respective MOSFETs 31b, 33b, and 35b are connected to one end of the fourth current driving unit 20b.

Further, the fourth current driving unit 20b includes a first MOSFET 21b, a second MOSFET 23b and a third MOSFET 25b. The drains of respective MOSFETs 21b, 23b, and 25b are connected to the sources of respective MOSFETs 31a, 33a, and 35a of the first current driving unit 30a, and the sources thereof are connected to the sources respective MOSFETs 31b, 33b, and 35b of the third current driving unit 30b.

Further, normal signals are input to respective gates of the second current driving unit 20a and the fourth current driving unit 20b, and inverted signals, obtained by inverting the signals input to the gates of the second current driving unit 20a and the fourth current driving unit 20b, are input to respective gates of the first current driving unit 30a and the third current driving unit 30b.

That is, a first logic input signal, input to the first MOSFETs 21a and 21b, is inverted and input to the first MOSFETs 31a and 31b. For example, when the first logic input signal, input to the first MOSFETs 21a and 21b, is A, the first logic input signal, input to the first MOSFETs 31a and 31b, is $\bar{A}$.

Similar to this, a second logic input signal B, input to the second MOSFETs 23a and 23b, is input in an inverted relationship with a second logic input signal $\bar{B}$ input to the second MOSFETs 33a and 33b. A second logic input signal C, input to the third MOSFETs 25a and 25b, is input in an inverted relationship with a second logic input signal $\bar{C}$ input to the second MOSFETs 35a and 35b. In addition, the first enable MOSFET 43 is connected to a node connected both to the drains of respective MOSFETs 31a, 33a, and 35a of the first current driving unit 30a and to the drains of respective MOSFETs 21a, 23a, and 25a of the second current driving unit 20a. In particular, the source of the first enable MOSFET 43 is connected to that node.

Further, the second enable MOSFET 41 is connected to a node connected both to the sources of respective MOSFETs 31b, 33b and 35b of the third current driving unit 30b and to the sources of respective MOSFETs 21b, 23b, and 25b of the fourth current driving unit 20b. In particular, the drain of the second enable MOSFET 41 is connected to that node.

The reason for this is that, since current flows through the first and second enable MOSFETs 43 and 41 only during a write period in which WE is maintained in a logic level '1', current is supplied from the current driving circuit 50 to the MTJ device 10, and thus a write operation can be performed.

Furthermore, voltages input to the gates of the first enable MOSFET 43 and the second enable MOSFET 41 are input in an inverted relationship with each other. For example, when a signal WE is input to the second enable MOSFET 41, a signal $\overline{WE}$ is input to the first enable MOSFET 43. That is, a normal signal is input to the second enable MOSFET 41, and an inverted signal is input to the first enable MOSFET 43.

Further, all MOSFETs used in the magnetic memory cell 1 according to the present invention, except for the second enable MOSFET 41, are preferably implemented as NMOS transistors, while the second enable MOSFET 41 is preferably implemented as a PMOS transistor.

In this case, a MOSFET, which is a Field Effect Transistor (FET) provided with an oxide insulating layer, is formed such that a gate is insulated from a source-drain conduction channel in a semiconductor by an oxide insulating layer, and such that a gate input voltage corresponding to a pulse sufficient to charge or eliminate an amount of input charge is required.

Therefore, when a certain voltage is not applied to the gates of each MOSFET, it is impossible to allow a drain-source current to flow through the MOSFET.

Figure 3:
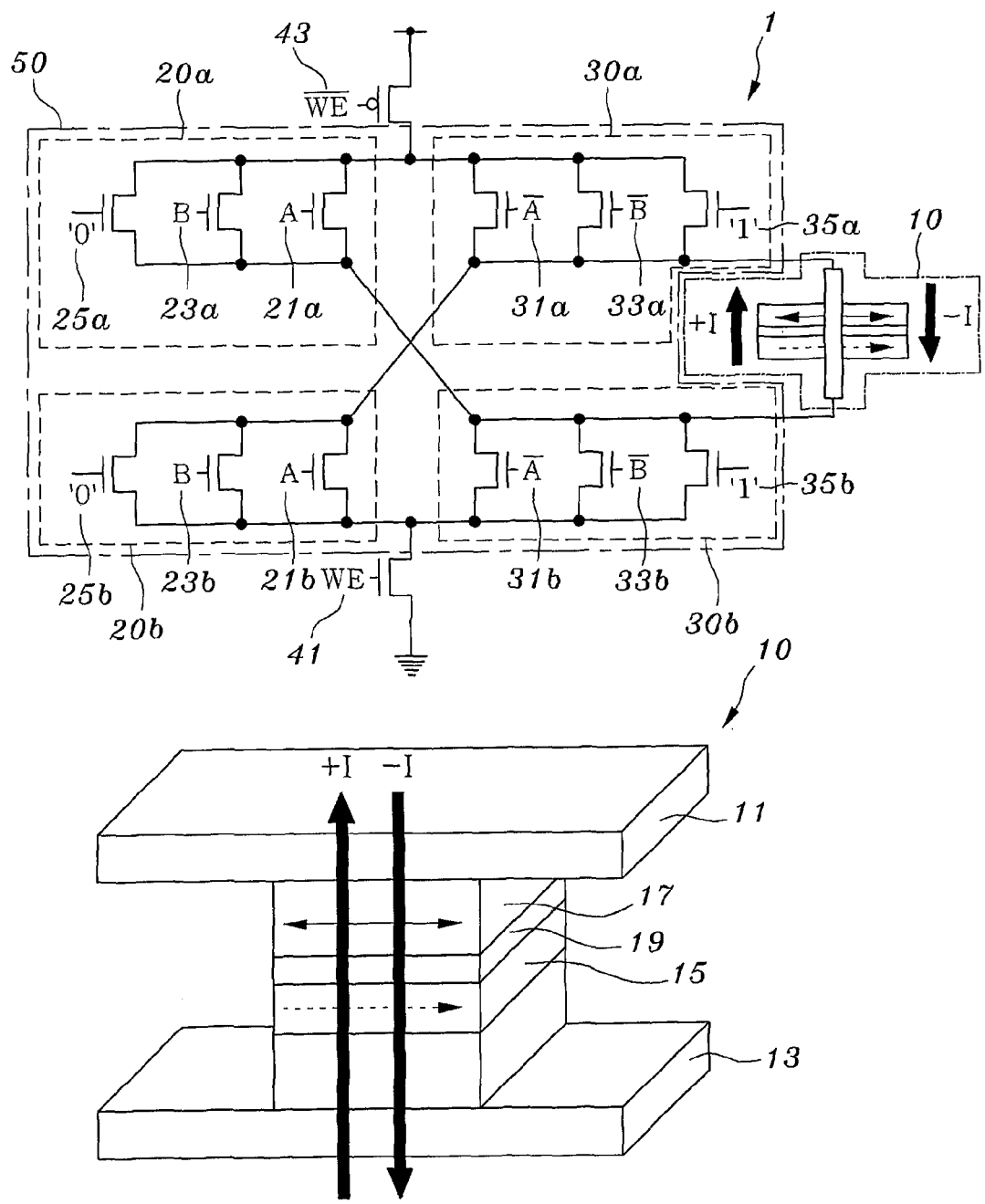
FIG. 3 illustrates a circuit diagram and a partially enlarged diagram of an AND logic circuit implemented using the magnetic memory cell according to the present invention.
Figure 4:
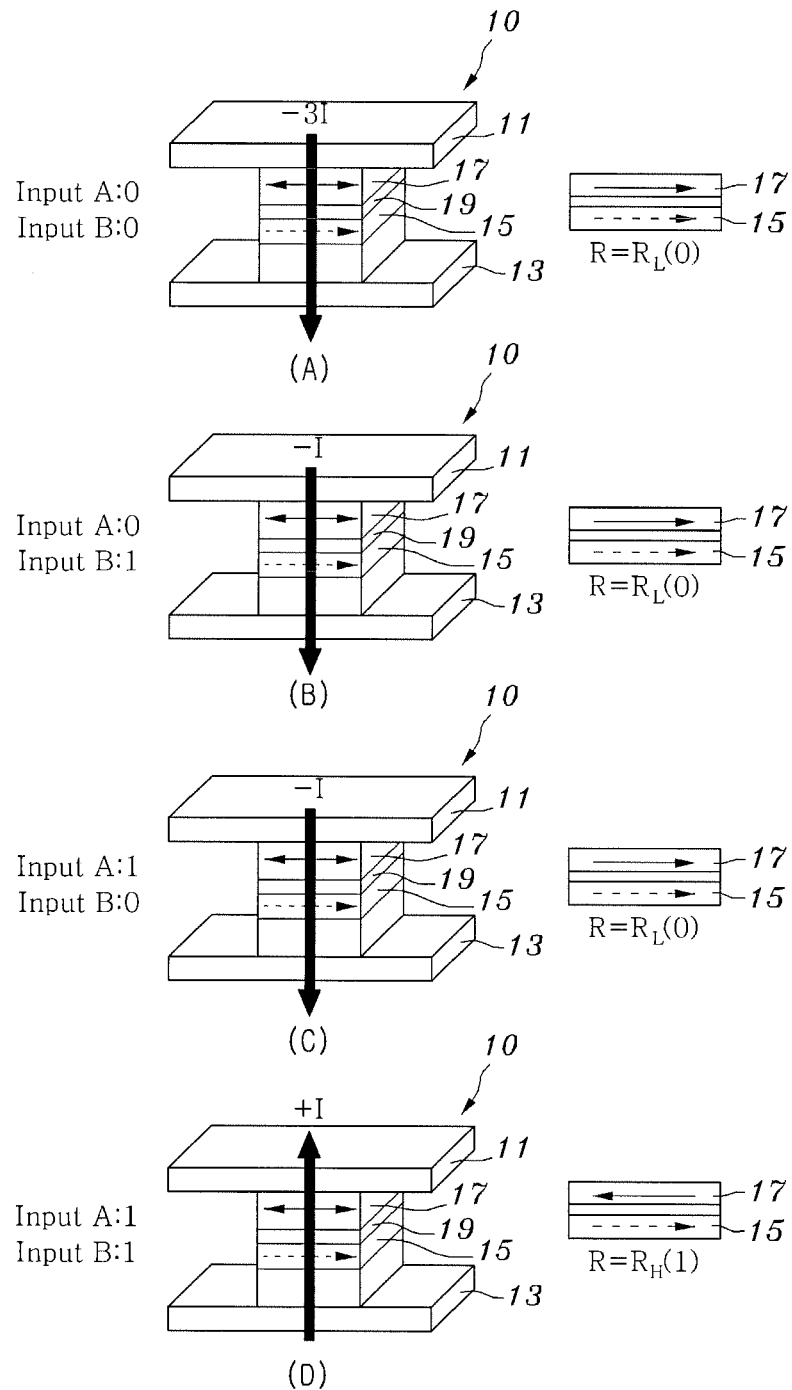
FIG. 4 is a diagram schematically showing the current direction and magnetization direction of an MTJ device based on the operation of the AND logic circuit.

FIG. 3 illustrates a circuit diagram and a partially enlarged diagram showing an AND logic circuit implemented using the magnetic memory cell according to the present invention, and FIG. 4 is a diagram schematically showing the current direction and magnetization direction of an MTJ device based on the operation of the AND logic circuit of FIG. 3.

As shown in the drawings, a magnetic memory cell 1 according to the present invention has the same construction as that of FIG. 2, and signals, input to the gates of respective third MOSFETs 25a, 25b, 35a, and 35b, are preset.

Hereinafter, the operating process of the AND logic circuit according to the present embodiment will be described below.

First, a logic level '1' is input to the gates of respective third MOSFETs 35a and 35b of a first current driving unit 30a and a third current driving unit 30b. A signal having a logic level '0', obtained by inverting the signal input to the gates of the third MOSFETs 35a and 35b of the first current driving unit 30a and the third current driving unit 30b, is input to the third MOSFETs 25a and 25b of a second current driving unit 20a and a fourth current driving unit 20b.

Further, certain voltages are applied to respective gates WE and $\overline{WE}$ of a first enable MOSFET 41 and a second enable MOSFET 43 so that current flows between the drain and source of each of the MOSFETs 41 and 43. Only during a write period in which an operation of writing data into the magnetic memory cell 1 according to the present invention is performed, the input signal having a logic level '1' is input to the gate WE.

In this case, in periods other than the write period of the magnetic memory cell 1, the magnetic resistance of the MTJ device 10 must be maintained without changing, and thus an input signal having a logic level '0' is input to the gate WE to prevent a current control circuit 50 according to the present invention from being driven. Further, when the direction of current flowing through the MTJ device 10 is a top to bottom direction, that is, the direction from a top electrode 11 to a bottom electrode 13, this current direction is defined as −I. When the direction of current flowing through the MTJ device 10 is a bottom to top direction, that is, the direction from the bottom electrode 13 to the top electrode 11, this current direction is defined as +I.

TABLE 2

| A | B | Current | R |
|---|---|---------|---|
| 0 | 0 | −3I | $R_L(0)$ |
| 0 | 1 | −I | $R_L(0)$ |
| 1 | 0 | −I | $R_L(0)$ |
| 1 | 1 | +I | $R_H(1)$ |

As shown in Table 2, when it is assumed that a logic input signal applied to respective first MOSFETs 21a and 21b is A, a logic input signal applied to respective second MOSFETs 23a and 23b is B, current applied to the MTJ device 10 according to the input signals A and B is 'current', and magnetic resistance generated by controlling a magnetization direction using the current is R, the operating process of the AND logic circuit is described below.

The first row of Table 2 corresponds to FIG. 4(a), and, here, the operation performed when '0' is input to A and '0' is input to 'B' is described below.

In this case, a logic level '0' is input to the gates A of the first MOSFETs 21a and 21b of the second current driving unit 20a and the fourth current driving unit 20b, a logic level '0' is input to the gates B of the second MOSFETs 23a and 23b, and a logic level '0' is preset and input to the gates C of the third MOSFETs 25a and 25b. Meanwhile, a logic level '1', obtained by inverting the input signal input to the gates A of the first MOSFETs 21a and 21b of the second current driving unit 20a and the fourth current driving unit 20b, is input to the gates $\bar{A}$ of the first MOSFETs 31a and 31b of the first current driving unit 30a and the third current driving unit 30b, a logic level '1', obtained by inverting the input signal, is input to the gates $\bar{B}$ of the second MOSFETs 33a and 33b, and a logic level '1' is preset and input to the gates $\bar{C}$ of the third MOSFETs 35a and 35b. That is, a voltage corresponding to a logic level '1' is applied to the first, second and third MOSFETs 31a, 33a and 35a of the first current driving unit 30a, and thus the MOSFETs 31a, 33a and 35a are operated to allow current to flow between the drain and source of each thereof.

Further, when the amount of current output from each MOSFET is assumed to be I, current I is output from each of the sources of the first, second and third MOSFETs 31a, 33a and 35a of the first current driving unit 30a. Since the MOSFETs are connected in parallel with each other in the first current driving unit 30a, three current outputs are combined with each other, and thus a current of 3*I is output.

Further, since the source terminals of the first, second and third MOSFETs 31a, 33a and 35a of the first current driving unit 30a are connected to the top electrode 11 of the MTJ device 10, the current 3I is applied in a top to bottom direction.

Therefore, since current flowing in the top to bottom direction is defined as −I, and current flowing in the bottom to top direction is defined as +I, a current of −3I is applied, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The second row of Table 2 corresponds to FIG. 4(b), and, here, the operation performed when '0' is input to A and '1' is input to B is described below.

In this case, a logic level '0' is input to the gates of the first MOSFETs 21a and 21b of the second current driving unit 20a and the fourth current driving unit 20b, a logic level '1' is input to the gates of the second MOSFETs 23a and 23b, and a logic level '0' is preset and input to the gates of the third MOSFETs 25a and 25b. Meanwhile, a logic level '1', obtained by inverting the signal input to the gates of the first MOSFETs 21a and 21b of the second current driving unit 20a and the fourth current driving unit 20b, is input to the gates of the first MOSFETs 31a and 31b of the first current driving unit 30a and the third current driving unit 30b. A logic level '0', obtained by inverting the input signal, is input to the gates of the second MOSFETs 33a and 33b, and a logic level '1' is preset and input to the gates of the third MOSFETs 35a and 35b.

That is, a voltage corresponding to the logic level '1' is applied to the gate of the second MOSFET 23a of the second current driving unit 20a, and thus the second MOSFET 23a is operated to allow current to flow between the drain and the source of the second MOSFET 23a. A voltage corresponding to the logic level '1' is applied to the gates of the first and third MOSFETs 31a and 35a of the first current driving unit 30a, and thus the first and third MOSFETs 31a and 35a are operated to allow current to flow between the drain and the source of each thereof.

Further, when the amount of current output from each MOSFET is assumed to be I, current I is output from the source of the second MOSFET 23a of the second current driving unit 20a, and current I is output from the first and third MOSFETs 31a and 35a of the first current driving unit 30a. Since the MOSFETs 31a and 35a are connected in parallel, a current of a total of 2*I is output.

Further, since the second current driving unit 20a is connected to the third current driving unit 30b, and the third current driving unit 30b is connected to the bottom electrode 13 of the MTJ device 10, the current I is applied in a bottom to top direction. Since the first current driving unit 30a is connected to the top electrode 11 of the MTJ device 10, the current 2I is applied in a top to bottom direction.

Therefore, since current flowing in the top to bottom direction is defined as −I, and current flowing in the bottom to top direction is defined as +I, a current corresponding to I+(−2I)=−I is applied to the MTJ device 10. The magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The third row of Table 2 corresponds to the case of FIG. 4(c), and, here, the operation performed when '1' is input to A and '0' is input to B is described below.

In this case, a logic level '1' is input to the gates of the first MOSFETs 21a and 21b of the second current driving unit 20a and the fourth current driving unit 20b, a logic level '0' is input to the gates of the second MOSFETs 33a and 33b, and a logic level '0' is preset and input to the gates of the third MOSFETs 25a and 25b. Meanwhile, a logic level '0', obtained by inverting the signal input to the gates of the first MOSFETs 21a and 21b of the second current driving unit 20a and the fourth current driving unit 20b, is input to the gates of the first MOSFETs 31a and 31b of the first current driving unit 30a and the third current driving unit 30b. A logic level '1', obtained by inverting the input signal, is input to the gates of the second MOSFETs 33a and 33b, and a logic level '1' is preset and input to the gates of the third MOSFETs 35a and 35b.

That is, a voltage corresponding to a logic level '1' is input to the gate of the first MOSFET 21a of the second current driving unit 20a, and thus the first MOSFET 21a is operated to allow current to flow between the drain and source thereof. A voltage corresponding to the logic level '1' is applied to the gates of the second and third MOSFETs 33a and 35a of the first current driving unit 30a, and thus the second and third MOSFETs 33a and 35a are operated to allow current to flow between the drain and source of each thereof.

Further, when the amount of current output from each MOSFET is assumed to be I, the current I is output from the source of the first MOSFET 21a of the second current driving unit 20a, and the current I is output from each of the sources of the second and third MOSFETs 33a and 35a of the first current driving unit 30a. Since the MOSFETs 33a and 35a are connected in parallel with each other, a current of a total of 2*I is output.

Further, since the second current driving unit 20a is connected to the third current driving unit 30b, and the third current driving unit 30b is connected to the bottom electrode 13 of the MTJ device 10, the current I is applied in a bottom to top direction. Since the first current driving unit 30a is connected to the top electrode 11 of the MTJ device 10, the current 2I is applied in the top to bottom direction.

Therefore, since the current flowing in the top to bottom direction is defined as –I, and the current flowing in the bottom to top direction is defined as +I, a current corresponding to I+(–2I)=–I is applied to the MTJ device 10, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The fourth row of Table 2 corresponds to the case of FIG. 4(d) and, here, the operation performed when '1' is applied to A and '1' is applied to 'B' is described below.

In this case, a logic level '1' is input to the gates of the first MOSFETs 21a and 21b of the second current driving unit 20a and the fourth current driving unit 20b, a logic level '1' is input to the gates of the second MOSFETs 23a and 23b, and a logic level '0' is input to the gates of the third MOSFETs 25a and 25b.

Meanwhile, a logic level '0', obtained by inverting the signal input to the gates of the first MOSFETs 21a and 21b of the second current driving unit 20a and the fourth current driving unit 20b, is input to the gates of the first MOSFETs 31a and 31b of the first current driving unit 30a and the third current driving unit 30b. A logic level '0', obtained by inverting the input signal, is input to the gates of the second MOSFETs 33a and 33b, and a logic level '1' is preset and input to the gates of the third MOSFETs 35a and 35b.

That is, a voltage corresponding to the logic level '1' is applied to the first and second MOSFETs 21a and 23a of the second current driving unit 20a, and thus the first and second MOSFETs 21a and 23a are operated to allow current to flow between the drain and source of each thereof. A voltage corresponding to the logic level '1' is applied to the third MOSFET 35a of the first current driving unit 30a, and thus the third MOSFET 35a is operated to allow current to flow between the drain and source thereof.

Further, when the amount of current output from each MOSFET is assumed to be I, the current I is output from each of the sources of the first and second MOSFETs 21a and 23a of the second current driving unit 20a. Since the first and second MOSFETs 21a and 23a are connected in parallel in the second current driving unit 20a, two current outputs are combined with each other, and thus a current of 2*I is output. The current I is output from the source of the third MOSFET 35a of the first current driving unit 30a.

Further, since the second current driving unit 20a is connected to the third current driving unit 30b, and the third current driving unit 30b is connected to the bottom electrode 13 of the MTJ device 10, the current 2I is applied in the bottom to top direction. Since the first current driving unit 30a is connected to the top electrode 11 of the MTJ device 10, the current I is applied in the top to bottom direction.

Therefore, since the current flowing in the top to bottom direction is defined as –I, and the current flowing in the bottom to top direction is defined as +I, a current corresponding to 2I+(–I)=I is applied, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

That is, the AND logic circuit according to the present embodiment can be implemented as a gate capable of performing an AND operation, which is given by the following Equation 2.

$$R \to A \cdot B \quad \text{[Equation 2]}$$

Figure 5:
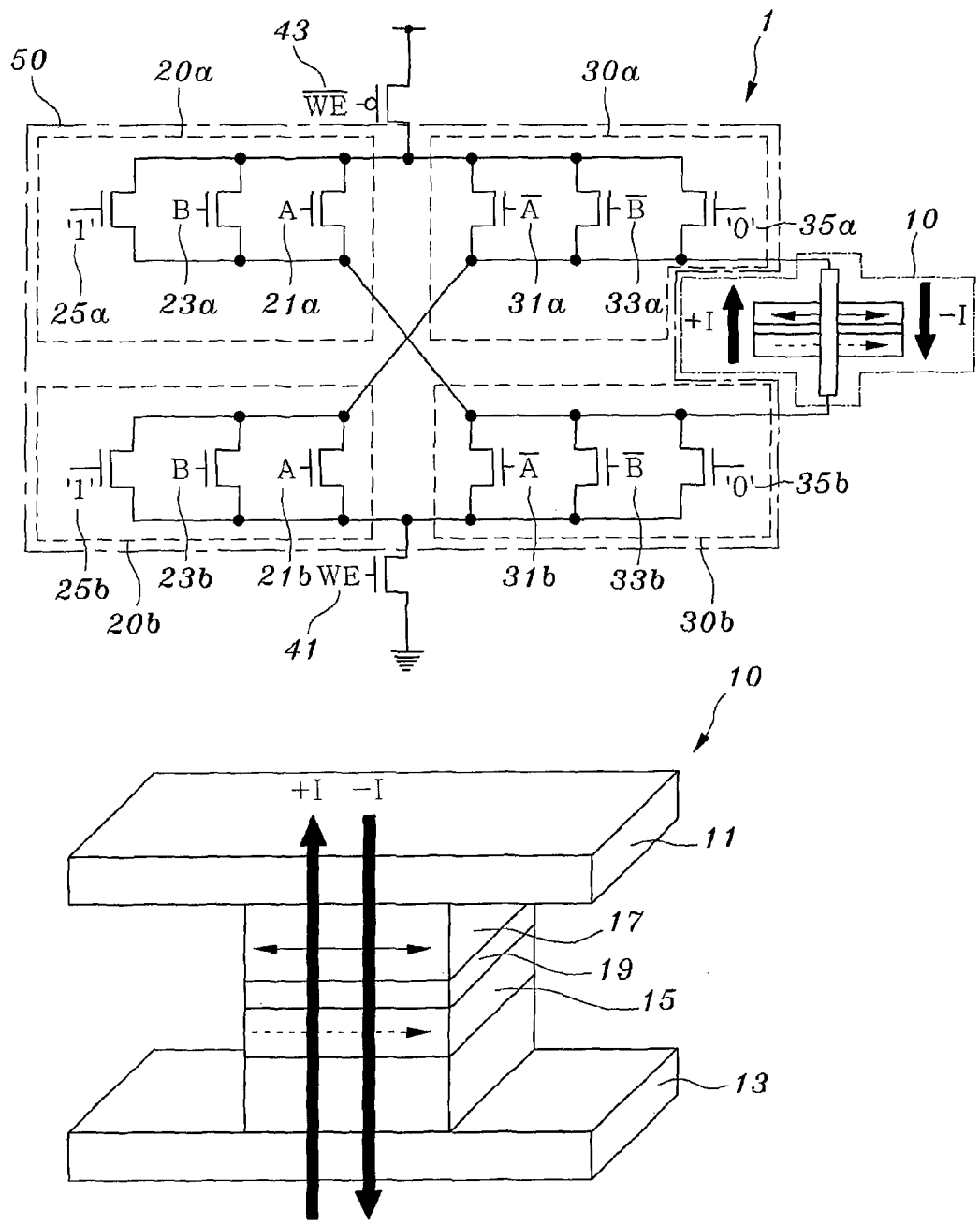
FIG. 5 illustrates a circuit diagram and a partially enlarged diagram of an OR logic circuit implemented using the magnetic memory cell according to the present invention.
Figure 6:
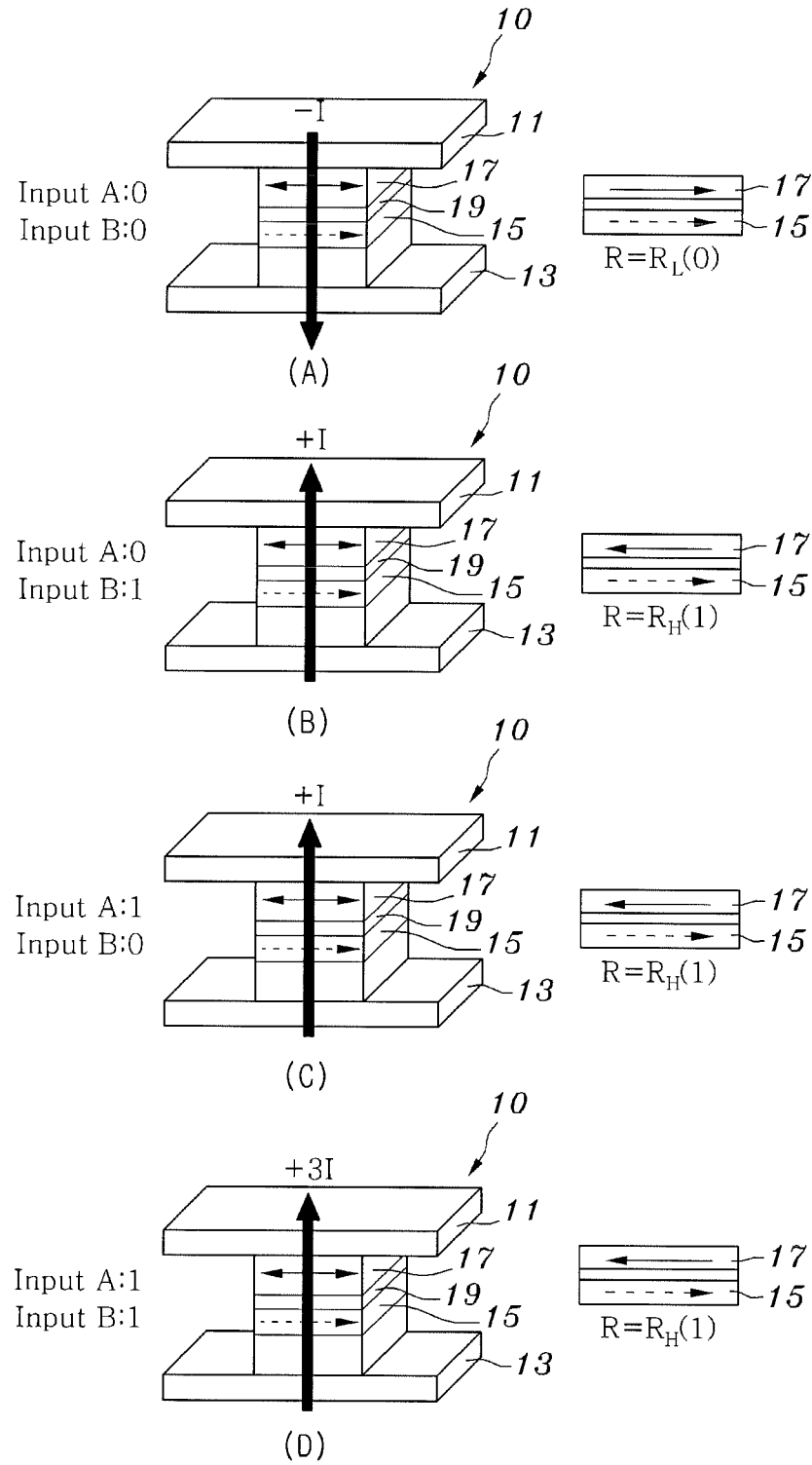
FIG. 6 is a diagram schematically showing the current direction and magnetization direction of an MTJ device based on the operation of the OR logic circuit of FIG. 5.

FIG. 5 illustrates a circuit diagram and a partially enlarged diagram showing an OR logic circuit implemented using the magnetic memory cell according to the present invention, and FIG. 6 is a diagram schematically showing the current direction and magnetization direction of the MTJ device based on the operation of the OR logic circuit of FIG. 5.

As shown in the drawings, a magnetic memory cell 1 according to the present invention has the same construction as that of FIG. 2, but signals input to the gates of third MOSFETs 25a and 25b and third MOSFETs 35a and 35b are preset to have an inverted relationship with each other.

Hereinafter, the operating process of the OR logic circuit according to the present embodiment will be described below.

First, a logic level '0' is input to the gates of the third MOSFETs 35a and 35b of a first current driving unit 30a and a third current driving unit 30b, and a logic level '1', obtained by inverting the signal input to the gates of the third MOSFETs 35a and 35b of the first current driving unit 30a and the third current driving unit 30b, is input to the third MOSFETs 25a and 25b of a second current driving unit 20a and a fourth current driving unit 20b.

Further, certain voltages are applied to respective gates WE and $\overline{WE}$ of a first enable MOSFET 41 and a second enable MOSFET 43 so that current flows between the drain and source of each of the enable MOSFETs 41 and 43. An input signal having a logic level '1' is applied to the gate WE only during a write period in which an operation of writing data into the magnetic memory cell 1 of the present invention is performed.

In this case, in periods other than the write period of the magnetic memory cell 1, the magnetic resistance of the MTJ device 10 must be maintained without being changed, and thus an input signal having a logic level '0' is applied to the gate WE to prevent a current control circuit 50 according to the present invention from being driven.

Further, when the direction of current flowing through the MTJ device 10 is a top to bottom direction, that is, the direction from a top electrode 11 to a bottom electrode 13, this current direction is defined as −I. When the direction of current flowing through the MTJ device 10 is a bottom to top direction, that is, the direction from the bottom electrode 13 to the top electrode 11, this current direction is defined as +I.

TABLE 3

| A | B | Current | R |
|---|---|---------|---|
| 0 | 0 | −I | $R_L$ (0) |
| 0 | 1 | +I | $R_H$ (1) |
| 1 | 0 | +I | $R_H$ (1) |
| 1 | 1 | +3I | $R_H$ (1) |

As shown in Table 3, when it is assumed that a logic input signal applied to respective first MOSFETs 21a and 21b is A, a logic input signal applied to respective second MOSFETs 23a and 23b is B, a current applied to the MTJ device 10 according to the input signals A and B is 'current' and magnetic resistance generated by controlling a magnetization direction using the current is R, the operating process of the OR logic circuit is described below.

The first row of Table 3 corresponds to the case of FIG. 6(a), and, here, the operation performed when '0' is input to A and '0' is input to B is described below.

In this case, a logic level '0' is input to the gates A of the first MOSFETs 21a and 21b of the second current driving unit 20a and the fourth current driving unit 20b, a logic level '0' is input to the gates B of the second MOSFETs 23a and 23b, and a logic level '1' is input to the gates C of the third MOSFETs 25a and 25b.

Meanwhile, a logic level '1', obtained by inverting the signal input to the gates A of the first MOSFETs 21a and 21b of the second current driving unit 20a and the fourth current driving unit 20b, is input to the gates $\bar{A}$ of the first MOSFETs 31a and 31b of the first current driving unit 30a and the third current driving unit 30b, a logic level '1', obtained by inverting the input signal, is input to the gates $\bar{B}$ of the second MOSFETs 33a and 33b, and a logic level '0' is preset and input to the gates $\bar{C}$ of the third MOSFETs 35a and 35b.

That is, a voltage corresponding to the logic level '1' is applied to the first and second MOSFETs 31a and 33a of first current driving unit 30a, and the third MOSFET 25a of the second current driving unit 20a. Accordingly, the first, second and third MOSFETs 31a, 33a and 25a are operated to allow current to flow between the drain and source of each thereof.

Further, when the amount of current output from each MOSFET is assumed to be I, current I is output from the source of the third MOSFET 25a of the second current driving unit 20a. Since the first and second MOSFETs 31a and 33a are connected in parallel in the first current driving unit 30a, a current of 2*I is output from the sources of the first and second MOSFETs 31a and 33a.

Further, since the source of the third MOSFET 25a of the second current driving unit 20a is connected to the drain of the third current driving unit 30b, and the drain of the third current driving unit 30b is connected to the bottom electrode 13 of the MTJ device 10, the current I is applied in a bottom to top direction. Since the sources of the first and second MOSFETs 31a and 33a of the first current driving unit 30a are connected to the top electrode 11 of the MTJ device 10, the current 2I is applied in a top to bottom direction.

Therefore, since the current flowing in the top to bottom direction is defined as −I, and the current flowing in the bottom to top direction is defined as +I, a current corresponding to I+(−2I)=−I is applied, the magnetization direction of the free layer 17 is changed to a right direction, and the magnetization directions of the free layer 17 and the fixed layer 15 are parallel with each other in the same direction, and thus the magnetic resistance of the MTJ device 10 is '0', which is a logic low level ($R_L$=0).

The second row of Table 3 corresponds to the case of FIG. 6(b), and, here, the operation performed when '0' is input to A and '1' is input to B is described below. In this case, a logic level '0' is input to the gates of the first MOSFETs 21a and 21b of the second current driving unit 20a and the fourth current driving unit 20b, a logic level '1' is input to the gates of the second MOSFETs 23a and 23b, and a logic level '1' is preset and input to the gates of the third MOSFETs 25a and 25b.

Meanwhile, a logic level '1', obtained by inverting the signal input to the gates of the first MOSFETs 31a and 31b of the second current driving unit 20a and the fourth current driving unit 20b, is input to the gates of the first MOSFETs 31a and 31b of the first current driving unit 30a and the third current driving unit 30b. A logic level '0', obtained by inverting the input signal, is input to the gates of the second MOSFETs 33a and 33b, and a logic level '0' is preset and input to the gates of the third MOSFETs 35a and 35b.

That is, a voltage corresponding to the logic level '1' is applied to the gates of the second and third MOSFETs 23a and 25a of the second current driving unit 20a, and thus the second and third MOSFETs 23a and 25a are operated to allow current to flow between the drain and source of each thereof. A voltage corresponding to a logic level '1' is applied to the gate of the first MOSFET 31a of the first current driving unit 30a, and thus the first MOSFET 31a is operated to allow current to flow between the drain and source of each of the second and third MOSFETs 23a and 25a and the first MOSFET 31a. Further, when the amount of current output from each MOSFET is assumed to be I, current I is output from each of the sources of the second and third MOSFETs 23a and 25a of the second current driving unit 20a. Since the second and third MOSFETs 23a and 25a are connected in parallel with each other, a current of a total of 2*I is output. The current I is output from the source of the first MOSFET 31a of the first current driving unit 30a. Further, since the second current driving unit 20a is connected to the third current driving unit 30b, and the third current driving unit 30b is connected to the bottom electrode 13 of the MTJ device 10, the current 2I is applied in a bottom to top direction. Since the first current driving unit 30a is connected to the top electrode 11 of the MTJ device 10, the current I is applied in a top to bottom direction.

Therefore, since the current flowing in the top to bottom direction is defined as −I, and the current flowing in the bottom to top direction is defined as +I, a current corresponding to 2I+(−I)=I is applied, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1). The third row of Table 3 corresponds to the case of FIG. 6(c), and, here, the operation performed when '1' is input to A and '0' is input to B is described below.

In this case, a logic level '1' is input to the gates of the first MOSFETs 21a and 21b of the second current driving unit 20a and the fourth current driving unit 20b, a logic level '0' is input to the gates of the second MOSFETs 23a and 23b, and a logic level '1' is preset and input to the gates of the third MOSFETs 25a and 25b.

Meanwhile, a logic level '0', obtained by inverting the signal input to the gates of the first MOSFETs 21a and 21b of the second current driving unit 20a and the fourth current driving unit 20b, is input to the gates of the first MOSFETs 31a and 31b of the first current driving unit 30a and the third current driving unit 30b, a logic level '1', obtained by inverting the input signal, is input to the gates of the second MOSFETs 33a and 33b, and a logic level '0' is preset and input to the gates of the third MOSFETs 35a and 35b.

That is, a voltage corresponding to the logic level '1' is applied to the gates of the first and third MOSFETs 21a and 25a of the second current driving unit 20a, and thus the MOSFETs 21a and 25a are operated to allow current to flow between the drain and source of each thereof. A voltage corresponding to the logic level '1' is applied to the gate of the second MOSFET 33a of the first current driving unit 30a, and thus the second MOSFET 33a is operated to allow current to flow between the drain and source thereof.

Further, when the amount of current output from each MOSFET is assumed to be I, current I is output from each of the sources of the first and third MOSFETs 21a and 25a of the second current driving unit 20a. Since the MOSFETs 21a and 25a are connected in parallel with each other, a current of a total of 2*I is output. Current I is output from the source of the second MOSFET 33a of the first current driving unit 30a.

Further, since the second current driving unit 20a is connected to the third current driving unit 30b, and the third current driving unit 30b is connected to the bottom electrode 13 of the MTJ device 10, the current 2I is applied in a bottom to top direction. Since the first current driving unit 30a is connected to the top electrode 11 of the MTJ device 10, the current I is applied in the top to bottom direction.

Therefore, since the current flowing in the top-bottom direction is defined as −I, and the current flowing in the bottom to top direction is defined as +I, a current corresponding to 2I+(−I)=I is applied, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

The fourth row of Table 3 corresponds to the case of FIG. 6(d), and, here, the operation performed when '1' is input to A and '1' is input to B is described below. In this case, a logic level '1' is input to the gates of the first MOSFETs 21a and 21b of the second current driving unit 20a and the fourth current driving unit 20b, a logic level '1' is input to the gates of the second MOSFETs 23a and 23b, and a logic level '1' is preset and input to the gates of the third MOSFETs 25a and 25b.

Meanwhile, a logic level '0', obtained by inverting the signal input to the gates of the first MOSFETs 21a and 21b of the second current driving unit 20a and the fourth current driving unit 20b, is input to the gates of the first MOSFETs 31a and 31b of the first current driving unit 30a and the third current driving unit 30b, a logic level '0', obtained by inverting the input signal, is input to the gates of the second MOSFETs 33a and 33b, and a logic level '0' is preset and input to the gates of the third MOSFETs 35a and 35b.

That is, a voltage corresponding to the logic level '1' is applied to the first, second and third MOSFETs 21a, 23a and 25a of the second current driving unit 20a, and thus the MOSFETs 21a, 23a and 25a are operated to allow current to flow between the drain and source of each thereof.

Further, when the amount of current output from each MOSFET is assumed to be I, current I is output from each of the sources of the first, second and third MOSFETs 21a, 23a and 25a of the second current driving unit 20a. Since the MOSFETs are connected in parallel with each other in the second current driving unit 20a, three current outputs are combined with each other, and thus a current of 3*I is output.

Furthermore, since the second current driving unit 20a is connected to the third current driving unit 30b, and the third current driving unit 30b is connected to the bottom electrode 13 of the MTJ device 10, the current 3I is applied in a bottom to top direction.

Therefore, since current flowing in the top to bottom direction is defined as −I, and current flowing in the bottom to top direction is defined as +I, the current 3I is applied, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

That is, the OR logic circuit according to the present embodiment can be implemented as a gate capable of performing an OR operation, which is given by the following Equation 3.

$$R=A+B \qquad \text{[Equation 3]}$$

Figure 7:
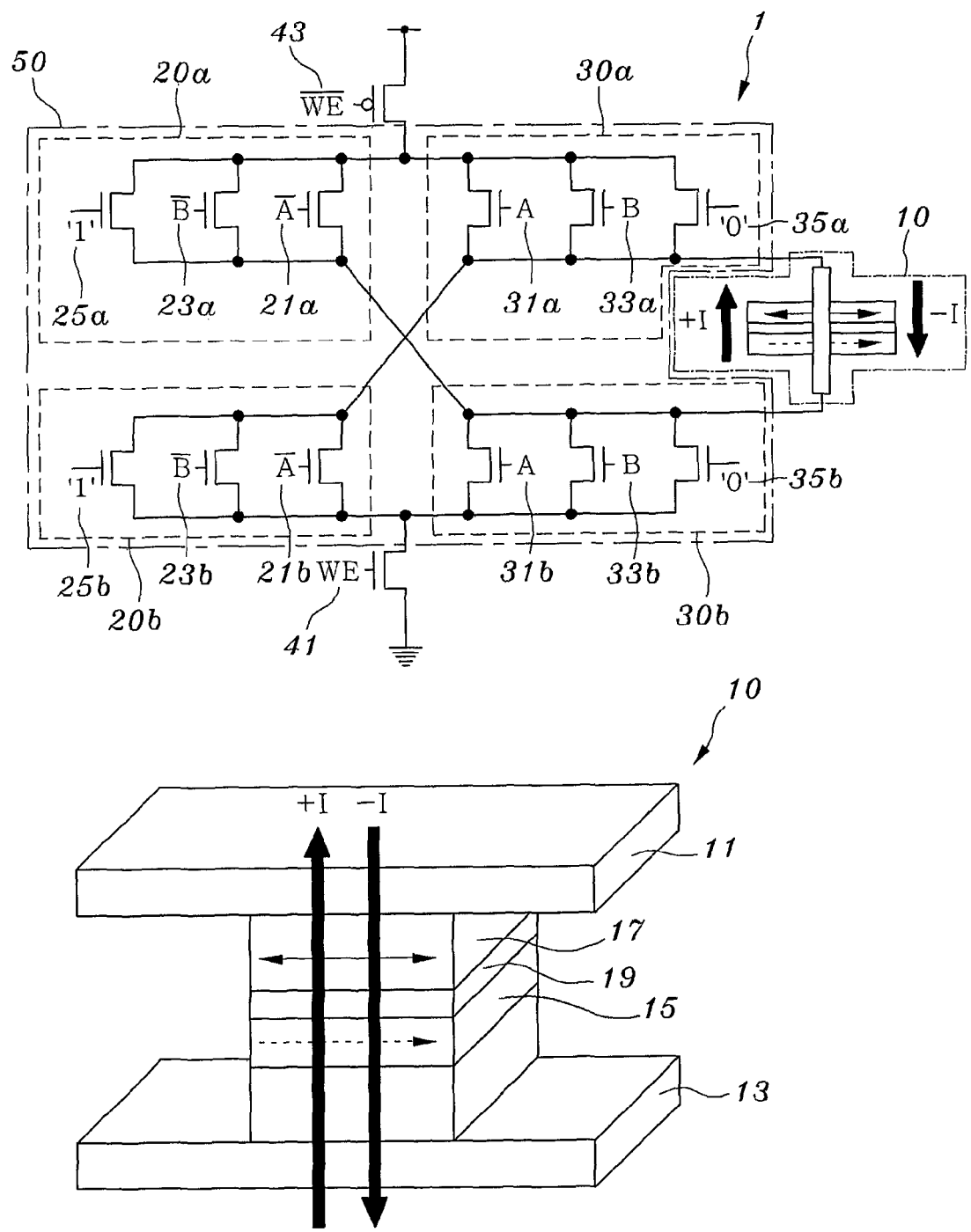
FIG. 7 illustrates a circuit diagram and a partially enlarged diagram showing a NAND logic circuit using the magnetic memory cell according to the present invention.
Figure 8:
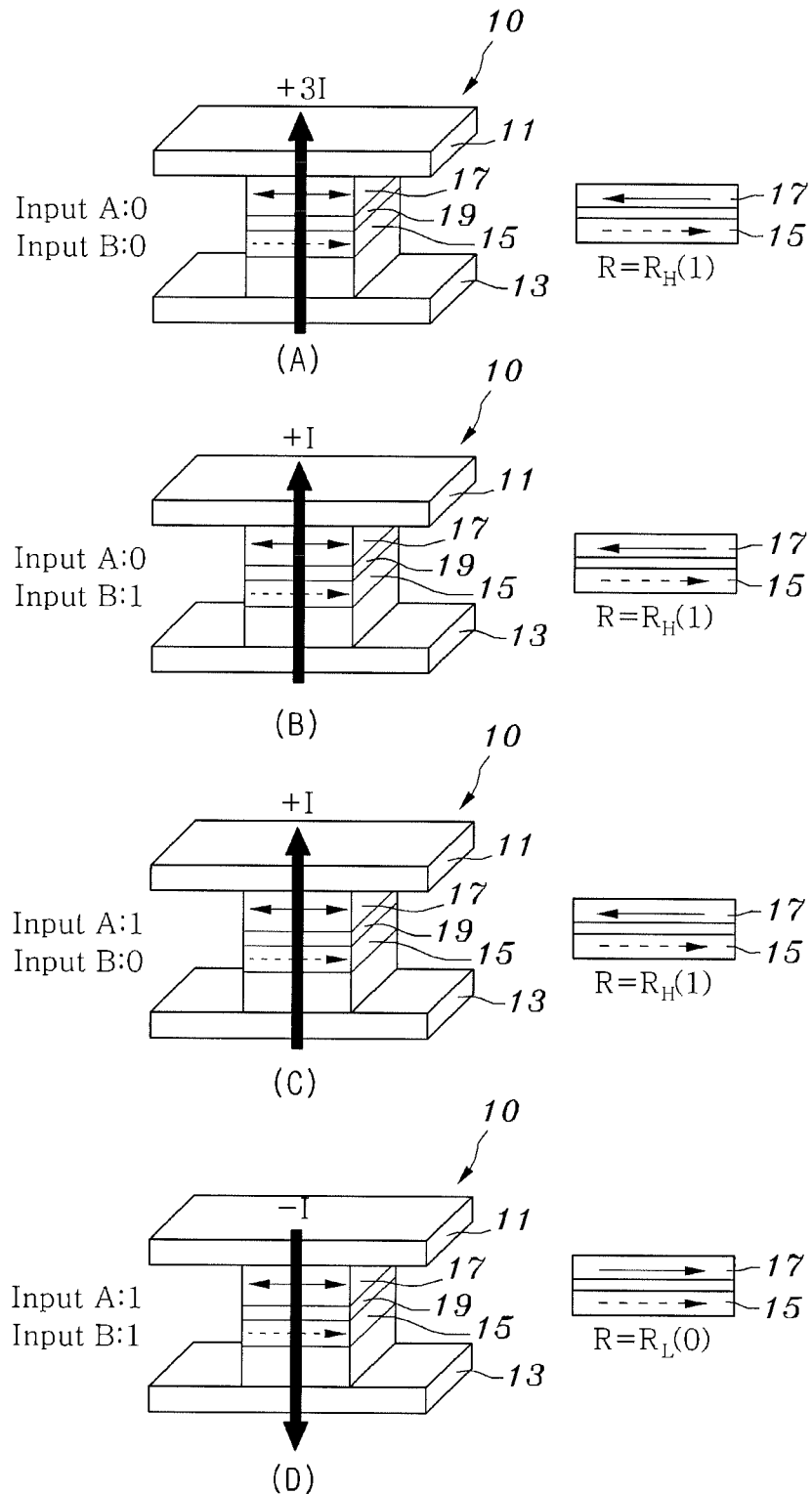
FIG. 8 is a diagram schematically showing the current direction and magnetization direction of an MTJ device based on the operation of the NAND logic circuit of FIG. 7.

FIG. 7 is a circuit diagram and a partially enlarged diagram showing a NAND logic circuit implemented using the magnetic memory cell according to the present invention, and FIG. 8 is a diagram schematically showing the current direction and magnetization direction of an MTJ device based on the operation of the NAND logic circuit of FIG. 7.

As shown in the drawings, a magnetic memory cell 1 according to the present invention has the same construction as that of FIG. 2, but normal signals are applied to first MOSFETs 31a and 31b and second MOSFETs 33a and 33b, signals, obtained by inverting the normal signals, are applied to first MOSFETs 21a and 21b and second MOSFETs 23a and 23b, and preset signals are applied to third MOSFETs 25a, 25b, 35a and 35b, and thus a NAND logic circuit is implemented.

Hereinafter, the operating process of the NAND logic circuit according to the present embodiment is described below.

First, a logic level '0' is input to the gates of the third MOSFETs 35a and 35b of a first current driving unit 30a and a third current driving unit 30b, and a signal having a logic level '1', obtained by inverting the signal input to the gates of the third MOSFETs 35a and 35b of the first current driving unit 30a and the third current driving unit 30b, is input to the third MOSFETs 25a and 25b of the second current driving unit 20a and the fourth current driving unit 20b.

Further, certain voltages are applied to the gates WE and $\overline{\text{WE}}$ of a first enable MOSFET 41 and a second enable MOSFET 43 so that current flows between the drain and the source of each thereof. An input signal having a logic level '1' is applied to the gate WE only during a write period in which an operation of writing data into the magnetic memory cell 1 according to the present invention is performed.

In this case, in periods other than the write period of the magnetic memory cell 1, the magnetic resistance of the MTJ device 10 must be maintained without being changed, and thus an input signal having a logic level '0' is input to the gate WE to prevent the current control circuit 50 of the present invention from being driven.

Further, when the direction of current flowing through the MTJ device 10 is a top to bottom direction, that is, the direction from a top electrode 11 to a bottom electrode 13, this current direction is defined as −I. When the direction of current flowing through the MTJ device 10 is a bottom to top direction, that is, the direction from the bottom electrode 13 to the top electrode 11, this current direction is defined as +I.

TABLE 4

| A | B | Current | R |
|---|---|---------|---|
| 0 | 0 | +3I | $R_H$ (1) |
| 0 | 1 | +I | $R_H$ (1) |
| 1 | 0 | +I | $R_H$ (1) |
| 1 | 1 | −I | $R_L$ (0) |

As shown in Table 4, when a logic input signal applied to respective first MOSFETs 31a and 31b is A, and a logic input signal applied to respective second MOSFETs 33a and 33b is B, current, applied to the MTJ device 10 according to the input signals A and B, is 'current', and magnetic resistance, generated by controlling the magnetization direction using the current, is R, the operating process of the NAND logic circuit is described below.

The first row of Table 4 corresponds to the case of FIG. 8(a), and, here, the operation performed when '0' is input to A and '0' is input to B is described below. In this case, a logic level '0' is input to the gates A of the first MOSFETs 31a and 31b of the first current driving unit 30a and the third current driving unit 30b, a logic level '0' is input to the gates B of the second MOSFETs 33a and 33b, and a logic level '0' is preset and input to the gates C of the third MOSFETs 35a and 35b.

Meanwhile, a logic level '1', obtained by inverting the signal input to the gates A of the first MOSFETs 31a and 31b of the first current driving unit 30a and the third current driving unit 30b, is input to the gates $A$ of the first MOSFETs 21a and 21b of the second current driving unit 20a and the fourth current driving unit 20b, a logic level '1', obtained by inverting the input signal, is input to the gates $B$ of the second MOSFETs 23a and 23b, and a logic level '1' is preset and input to the gates $C$ of the third MOSFETs 25a and 25b.

That is, a voltage corresponding to the logic level '1' is applied to the first, second and third MOSFETs 21a, 23a and 25a of the second current driving unit 20a, and thus the MOSFETs 21a, 23a and 25a are operated to allow current to flow between the drain and source of each thereof.

Further, when the amount of current output from each MOSFET is assumed to be I, a current of 3*I is output from each of the sources of the first, second and third MOSFETs 21a, 23a, and 25a of the second current driving unit 20a because the MOSFETs 21a, 23a and 25a are connected in parallel.

Further, since the sources of the first, second and third MOSFETs 21a, 23a and 25a of the second current driving unit 20a are connected to the drains of the MOSFETs 31a, 33a and 35a of the third current driving unit 30b, and the third current driving unit 30b is connected to the bottom electrode 13 of the MTJ device 10, the current 3I is applied in a bottom to top direction.

Therefore, since current flowing in the top to bottom direction is defined as −I, and current flowing in the bottom to top direction is defined as +I, the current 3I is applied, the magnetization direction of the free layer is changed to a left direction, the magnetization directions of the free layer 17 and the fixed layer 15 are anti-parallel, and thus the magnetic resistance of the MTJ device 10 is '1', which is a logic high level ($R_H$=1).

The second row of Table 4 corresponds to the case of FIG. 8(b), and, here, the operation performed when '0' is input to A and '1' is input to B is described below. In this case, a logic level '0' is input to the gates A of the first MOSFETs 31a and 31b of the first current driving unit 30a and the third current driving unit 30b, a logic level '1' is input to the gates B of the second MOSFETs 33a and 33b, and a logic level '0' is preset and input to the gates C of the third MOSFETs 35a and 35b.

Meanwhile, a logic level '1', obtained by inverting the signal, input to the gates A of the first MOSFETs 31a and 31b of the first current driving unit 30a and the third current driving unit 30b, is input to the gates $A$ of the first MOSFETs 21a and 21b of the second current driving unit 20a and the fourth current driving unit 20b. A logic level '0', obtained by inverting the input signal, is input to the gates $B$ of the second MOSFETs 23a and 23b, and a logic level '1' is preset and input to the gates $C$ of the third MOSFETs 25a and 25b.

That is, a voltage corresponding to the logic level '1' is applied to the gate of the second MOSFET 33a of the first current driving unit 30a, and thus the second MOSFET 33a is operated to allow current to flow between the drain and source thereof. A voltage corresponding to the logic level '1' is applied to the gates of the first and third MOSFETs 21a and 25a of the second current driving unit 20a, and thus the MOSFETs 21a and 25a are operated to allow current to flow between the drain and source of each thereof.

Further, when the amount of current output from each MOSFET is assumed to be I, current I is output from the source of the second MOSFET 33a of the first current driving unit 30a, and current I is output from each of the sources of the first and third MOSFETs 21a and 25a of the second current driving unit 20a. Since the MOSFETs 21a and 25a are connected in parallel, a current of a total of 2*I is output.

Further, since the first current driving unit 30a is connected to the top electrode of the MTJ device 10, the current I is applied in a top to bottom direction. Since the second current driving unit 20a is connected to the third current driving unit 30b, and the third current driving unit 30b is connected to the bottom electrode 13 of the MTJ device 10, the current 2I is applied in the bottom to top direction.

Therefore, when current flowing in the top to bottom direction is defined as −I, and current flowing in the bottom to top direction is defined as +I, a current corresponding to (−I)+2I=I is applied, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1). The third row of Table 4 corresponds to the case of FIG. 8(c), and, here, the operation performed when '1' is input to A, and '0' is input to B is described below.

In this case, a logic level '1' is input to the gates A of the first MOSFETs 31a and 31b of the first current driving unit 30a and the third current driving unit 30b, a logic level '0' is input to the gate B of the second MOSFETs 33a and 33b, and a logic level '0' is preset and input to the gates C of the third MOSFETs 35a and 35b. Meanwhile, a logic level '0', obtained by inverting the signal input to the gates A of the first MOSFETs 31a and 31b of the first current driving unit 30a and the third current driving unit 30b, is input to the gate A of the first MOSFETs 21a and 21b of the second current driving unit 20a and the fourth current driving unit 20b, a logic level '1', obtained by inverting the input signal, is input to the gates B of the second MOSFETs 23a and 23b, and a logic level '1' is preset and input to the gates C of the third MOSFETs 25a and 25b.

That is, a voltage corresponding to the logic level '1' is applied to the gate of the first MOSFET 31a of the first current driving unit 30a, and thus the MOSFET 31a is operated to allow current to flow between the drain and source thereof. A voltage corresponding to the logic level '1' is applied to the gates of the second and third MOSFETs 23a and 25a of the second current driving unit 20a, and thus the MOSFETs 23a and 25a are operated to allow current to flow between the drain and source of each thereof.

Further, when the amount of current output from each MOSFET is assumed to be I, current I is output from the source of the first MOSFET 31a of the first current driving unit 30a, and current I is output from each of the second and third MOSFETs 23a and 25a of the second current driving unit 20a. Since the MOSFETs 23a and 25a are connected in parallel, a current of a total of 2*I is output.

Further, since the first current driving unit 30a is connected to the top electrode of the MTJ device 10, the current I is applied in a top to bottom direction. Since the second current driving unit 20a is connected to the third current driving unit 30b, and the third current driving unit 30b is connected to the bottom electrode 13 of the MTJ device 10, the current 2I is applied in a bottom to top direction.

Therefore, since current flowing in the top to bottom direction is defined as −I, and current flowing in the bottom to top direction is defined as +I, a current corresponding to (−I)+2I=I is applied, the magnetization direction of the free layer 17 is changed to a left direction, and the magnetization directions of the free layer 17 and the fixed layer 15 are antiparallel, and thus the magnetic resistance of the MTJ device 10 is '1', which is a logic high level ($R_H$=1). The fourth row of Table 4 corresponds to the case of FIG. 8(d), and, here, the operation performed when '1' is applied to both A and B is described below.

In this case, a logic level '1' is input to the gates A of the first MOSFETs 31a and 31b of the first current driving unit 30a and the third current driving unit 30b, a logic level '1' is input to the gates B of the second MOSFETs 33a and 33b, and a logic level '0' is preset and input to the gates C of the third MOSFETs 35a and 35b. Meanwhile, a logic level '0', obtained by inverting the signal input to the gates A of the first MOSFETs 31a and 31b of the first current driving unit 30a and the third current driving unit 30b, is input to the gates A of the first MOSFETs 21a and 21b of the second current driving unit 20a and the fourth current driving unit 20b, a logic level '0', obtained by inverting the input signal, is applied to the gates B of the second MOSFETs 23a and 23b, and a logic level '1' is preset and input to the gates C of the third MOSFETs 25a and 25b.

That is, a voltage corresponding to the logic level '1' is applied to the gates of the first and second MOSFETs 31a and 33a of the first current driving unit 30a, and thus the MOSFETs 31a and 33a are operated to allow current to flow between the drain and source of each thereof. A voltage corresponding to the logic level '1' is applied to the gate of the third MOSFET 25a of the second current driving unit 20a, and thus the MOSFET 25a is operated to allow current to flow between the drain and source thereof.

Further, when the amount of current output from each MOSFET is assumed to be I, current I is output from each of the sources of the first and second MOSFETs 31a and 33a of the first current driving unit 30a. Since the first and second MOSFETs 31a and 33a are connected in parallel, a current of a total of 2*I is output, and current I is output from the source of the third MOSFET 25a of the second current driving unit 20a.

Further, since the first current driving unit 30a is connected to the top electrode of the MTJ device 10, the current 2I is applied in a top to bottom direction. Since the second current driving unit 20a is connected to the third current driving unit 30b, and the third current driving unit 30b is connected to the bottom electrode 13 of the MTJ device 10, the current I is applied in a bottom to top direction.

Therefore, since current flowing in the top to bottom direction is defined as −I, and current flowing in the bottom to top direction is defined as +I, a current corresponding to (−2I)+I=−I is applied, the magnetization direction of the free layer 17 is changed to a right direction, and the magnetization directions of the free layer 17 and the fixed layer 15 are parallel in the same direction, and thus the magnetic resistance of the MTJ device 10 is '0' which is a logic low level ($R_L$=0).

That is, the NAND logic circuit according to the present embodiment can be implemented as a gate capable of performing a NAND operation, which is given by the following Equation 4.

$$R = \overline{A \cdot B} = \overline{A} + \overline{B} \quad [\text{Equation 4}]$$

Figure 10:
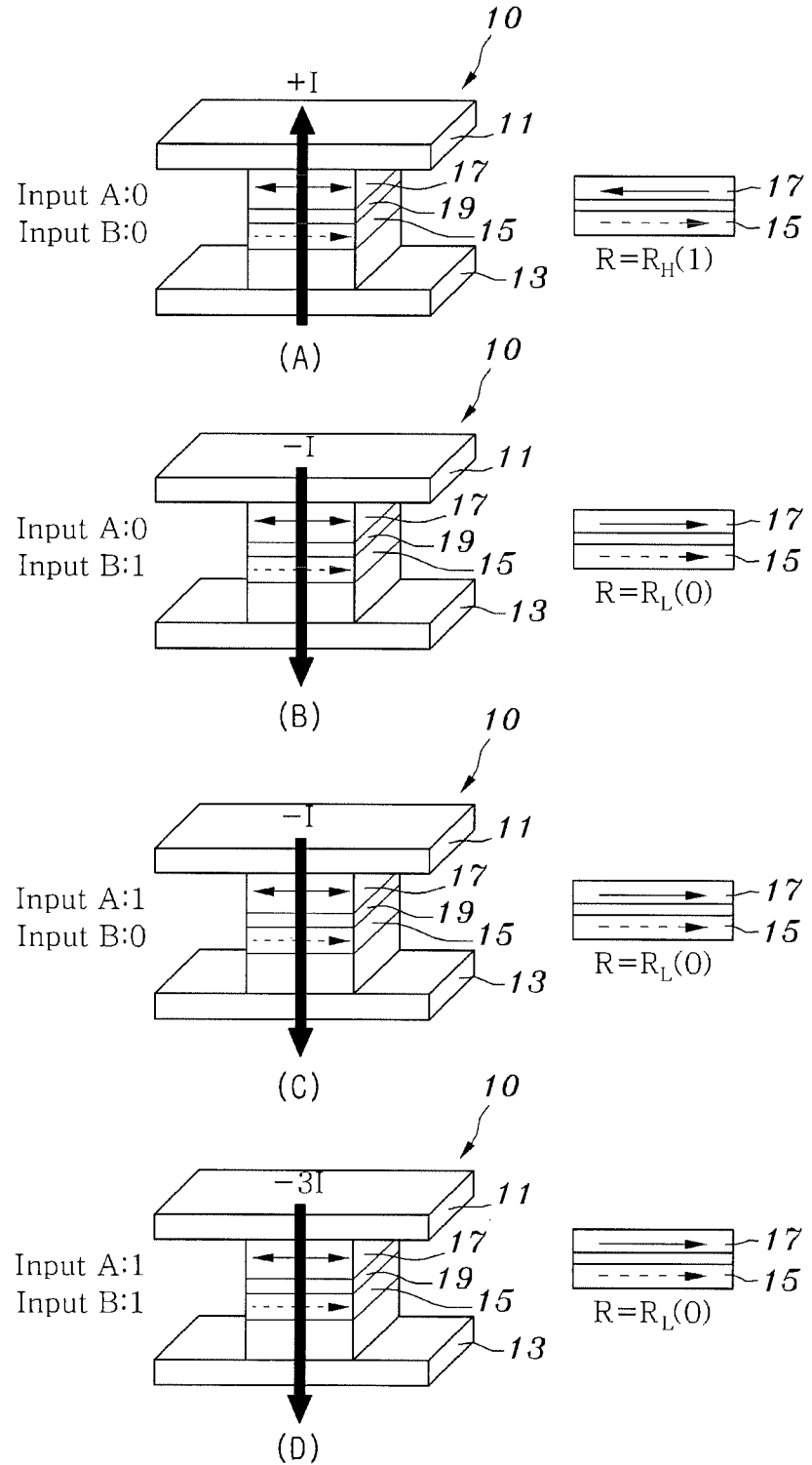
FIG. 10 is a diagram schematically showing the current direction and magnetization direction of an MTJ device based on the operation of the NOR logic circuit of FIG. 9.

FIG. 9 illustrates a circuit diagram and a partially enlarged diagram showing a NOR logic circuit implemented using the magnetic memory cell according to the present invention, and FIG. 10 is a diagram schematically showing the current direction and magnetization direction of the NOR logic circuit of FIG. 9.

As shown in the drawings, a magnetic memory cell 1 according to the present invention has the same construction as that of FIG. 2, but normal signals are applied to first MOSFETs 31a and 31b and second MOSFETs 33a and 33b, signals, obtained by inverting the normal signal, are applied to first MOSFETs 21a and 21b and second MOSFETs 23a and 23b, and preset signals are applied to third MOSFETs 25a, 25b, 35a and 35b, and thus a NOR logic circuit is implemented.

First, a logic level '1' is input to the gates of respective third MOSFETs 35a and 35b of the first current driving unit 30a and the third current driving unit 30b. A signal having a logic level '0', which is obtained by inverting the signal input to the gates of the third MOSFETs 35a and 35b of the first current driving unit 30a and the third current driving unit 30b, is input to the third MOSFETs 25a and 25b of the second current driving unit 20a and the fourth current driving unit 20b.

Further, certain voltages are applied to respective gates WE and $\overline{WE}$ of a first enable MOSFET 41 and a second enable MOSFET 43 so that current flows between the drain and source of each of the enable MOSFETs 41 and 43. Only during a write period in which an operation of writing data into the magnetic memory cell 1 according to the present invention is performed, an input signal having a logic level '1' is applied to the gate WE.

In this case, in periods other than the write period of the magnetic memory cell 1, the magnetic resistance of the MTJ device 10 must be maintained without being changed, and thus an input signal having a logic level '0' is applied to the gate WE to prevent the current control circuit 50 of the present invention from being driven.

Further, when the direction of current flowing through the MTJ device 10 is a top to bottom direction, that is, the direction from the top electrode 11 to the bottom electrode 13, this current direction is defined as −I. When the direction of current flowing through the MTJ device 10 is a bottom to top direction, that is, the direction from the bottom electrode 13 to the top electrode 11, this current direction is defined as +I.

TABLE 5

| A | B | Current | R |
|---|---|---------|---|
| 0 | 0 | +I  | $R_H$ (1) |
| 0 | 1 | −I  | $R_L$ (0) |
| 1 | 0 | −I  | $R_L$ (0) |
| 1 | 1 | −3I | $R_L$ (0) |

As shown in Table 5, when it is assumed that a logic input signal applied to respective first MOSFETs 31a and 31b is A, a logic input signal applied to respective second MOSFETs 33a and 33b is B, current applied to the MTJ device 10 according to the input signals A and B is 'current', and magnetic resistance generated by controlling a magnetization direction using the current is R, the operating process of the NOR logic circuit is described below.

The first row of Table 5 corresponds to the case of FIG. 10(*a*), and, here, the operation performed when '0' is input to both A and B is described here below.

In this case, a logic level '0' is input to the gates A of the first MOSFETs 31a and 31b of the first current driving unit 30a and the third current driving unit 30b, a logic level '0' is input to the gates B of the second MOSFETs 33a and 33b, and a logic level '1' is preset and input to the gates C of the third MOSFETs 35a and 35b.

Meanwhile, a logic level '1', obtained by inverting the input signal input to the gates A of the first MOSFETs 31a and 31b of the first current driving unit 30a and the third current driving unit 30b, is input to the gates $\bar{A}$ of the first MOSFETs 21a and 21b of the second current driving unit 20a and the fourth current driving unit 20b, a logic level '1', obtained by inverting the input signal, is input to the gates $\bar{B}$ of the second MOSFETs 23a and 23b, and a logic level '0' is preset and input to the gates $\bar{C}$ of the third MOSFETs 25a and 25b.

That is, a voltage corresponding to the logic level '1' is applied to the third MOSFET 35a of the first current driving unit 30a and the first and second MOSFETs 21a and 23a of the second current driving unit 20a, and thus the MOSFETs 35a, 21a and 23a are operated to allow current to flow between the drain and source of each thereof.

Further, when the amount of current output from each MOSFET is assumed to be I, current I is output from the source of the third MOSFET 35a of the first current driving unit 30a. Since the first and second MOSFETs 21a and 23a of the second current driving unit 20a are connected in parallel, a current of a total of 2*I is output.

Further, since the source of the third MOSFET 35a of the first current driving unit 30a is connected to the top electrode 11 of the MTJ device 10, the current I is applied in a top to bottom direction. Since the second current driving unit 20a is connected to the third current driving unit 30b, and the third current driving unit 30b is connected to the bottom electrode 13 of the MTJ device 10, the current 2I is applied in the bottom to top direction.

Therefore, since current flowing in the top to bottom direction is defined as −I, and current flowing in the bottom to top direction is defined as +I, a current corresponding to (−I)+2I=I is applied to the MTJ device 10, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

The second row of Table 5 corresponds to the case of FIG. 10(*b*), and, here, the operation performed when '0' is input to A and '1' is input to 'B' is described below. In this case, a logic level '0' is input to the gates A of the first MOSFETs 31a and 31b of the first and third current driving units 30a and 30b, a logic level '1' is input to the gates B of the second MOSFETs 33a and 33b, and a logic level '1' is preset and input to the gates C of the third MOSFETs 35a and 35b.

Meanwhile, a logic level '1', obtained by inverting the signal input to the gates A of the first MOSFETs 31a and 31b of the first current driving unit 30a and the third current driving unit 30b, is input to the gates $\bar{A}$ of the first MOSFETs 21a and 21b of the second current driving unit 20a and the fourth current driving unit 20b, a logic level '0', obtained by inverting the input signal, is input to the gates $\bar{B}$ of the second MOSFETs 23a and 23b, and a logic level '0' is preset and input to the gates $\bar{C}$ of the third MOSFETs 25a and 25b.

That is, a voltage corresponding to the logic level '1' is applied to the gates of the second and third MOSFETs 33a and 35a of the first current driving unit 30a, a voltage corresponding to the logic level '1' is applied to the gate of the first MOSFET 21a of the second current driving unit 20a, and thus the MOSFETs 33a, 35a and 21a are operated to allow current to flow between the drain and source of each thereof.

Further, when the amount of current output from each MOSFET is assumed to be I, current I is output from each of the sources of the second and third MOSFETs 33a and 35a of the first current driving unit 30a. Since the MOSFETs 33a and 35a are connected in parallel, a current of a total of 2*I is output. Current I is output from the source of the first MOSFET 21a of the second current driving unit 20a.

Further, since the first current driving unit 30a is connected to the top electrode of the MTJ device 10, the current 2I is applied in a top to bottom direction. Since the second current driving unit 20a is connected to the third current driving unit 30b, and the third current driving unit 30b is connected to the bottom electrode 13 of the MTJ device 10, current I is applied in a bottom to top direction.

Therefore, since current flowing in the top to bottom direction is defined as −I, and current flowing in the bottom to top direction is defined as +I, a current corresponding to (−2I)+I=−I is applied, the magnetization direction of the free layer 17 is changed to a right direction, the magnetization directions of the free layer 17 and the fixed layer 15 are parallel in the same direction, and thus the magnetic resistance of the MTJ device 10 is '0', which is a logic low level ($R_L$=0). The third row of Table 5 corresponds to the case of FIG. 10(*c*), and, here, the operation performed when '1' is input to A and '0' is input to B is described below. In this case, a logic level '1' is input to the gates A of the first MOSFETs 31a and 31b of the first current driving unit 30a and the third current driving unit 30b, a logic level '0' is input to the gates B of the second MOSFETs 33a and 33b, and a logic level '1' is preset and input to the gates C of the third MOSFETs 35a and 35b. Meanwhile, a logic level '0', obtained by inverting the signal, input to the gates A of the first MOSFETs 31a and 31b of the first current driving unit 30a and the third current driving unit 30b, is input to the gates $\bar{A}$ of the first MOSFETs 21a and 21b of the second current driving unit 20a and the fourth current driving unit 20b, a logic level '1', obtained by inverting the input signal, is input to the gates $\bar{B}$ of the second MOSFETs 23a and 23b, and a logic level '0' is preset and input to the gates $\bar{C}$ of the third MOSFETs 25a and 25b.

That is, a voltage corresponding to the logic level '1' is applied to the gates of the first and third MOSFETs 31a and 35a of the first current driving unit 30a, and thus the MOSFETs 31a and 35a are operated to allow current to flow between the drain and source of each thereof. A voltage corresponding to the logic level '1' is applied to the gate of the second MOSFET 23a of the second current driving unit 20a, and thus the second MOSFET 20a is operated to allow current to flow between the drain and source thereof.

Further, when the amount of current output from each MOSFET is assumed to be I, current I is output from each of the sources of the first and third MOSFETs 31a and 35a of the first current driving unit 30a. Since the MOSFETs 31a and 35a are connected in parallel, a current of a total of 2*I is output. The current I is output from the source of the second MOSFET 23a of the second current driving unit 20a.

Further, since the first current driving unit 30a is connected to the top electrode of the MTJ device 10, the current 2I is applied in a top to bottom direction. Since the second current driving unit 20a is connected to the third current driving unit 30b, and the third current driving unit 30b is connected to the bottom electrode 13 of the MTJ device 10, the current I is applied in a bottom to top direction.

Therefore, since current flowing in the top to bottom direction is defined as −I, and current flowing in the bottom to top direction is defined as +I, a current corresponding to (−2I)+I=−I is applied, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The fourth row of Table 5 corresponds to the case of FIG. 10(d), and, here, the operation performed when '1' is applied to both A and B is described below.

In this case, a logic level '1' is input to the gates A of the first MOSFETs 31a and 31b of the first current driving unit 30a and the third current driving unit 30b, a logic level '1' is input to the gates B of the second MOSFETs 33a and 33b, and a logic level '1' is preset and input to the gates C of the third MOSFETs 35a and 35b.

Meanwhile, a logic level '0', obtained by inverting the signal input to the gates A of the first MOSFETs 31a and 31b of the first current driving unit 30a and the third current driving unit 30b, is input to the gates $\bar{A}$ of the first MOSFETs 21a and 21b of the second current driving unit 20a and the fourth current driving unit 20b, a logic level '0', obtained by inverting the input signal, is input to the gates $\bar{B}$ of the second MOSFETs 23a and 23b, and a logic level '0' is preset and input to the gates $\bar{C}$ of the third MOSFETs 25a and 25b.

That is, a voltage corresponding to the logic level '1' is applied to the gates of the first, second and third MOSFETs 31a, 33a and 35a of the first current driving unit 30a, and thus the MOSFETs 31a, 33a and 35a are operated to allow current to flow between the drain and source of each thereof.

Further, when the amount of current output from each MOSFET is assumed to be I, current I is output from each of the sources of the first, second and third MOSFETs 31a, 33a and 35a of the first current driving unit 30a. Since the MOSFETs are connected in parallel, a current of a total of 3*I is output.

Further, since the first current driving unit 30a is connected to the top electrode of the MTJ device 10, the current 3I is applied in a top to bottom direction.

Therefore, since current flowing in the top to bottom direction is defined as −I, and current flowing in the bottom to top direction is defined as +I, a current of −3I is applied to the MTJ device 10, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0). That is, the NOR logic circuit according to the present embodiment can be implemented as a gate capable of performing a NOR operation, which is given in the following Equation 5.

$$R = \overline{A+B} = \overline{A} \cdot \overline{B} \qquad \text{[Equation 5]}$$

Figure 11:
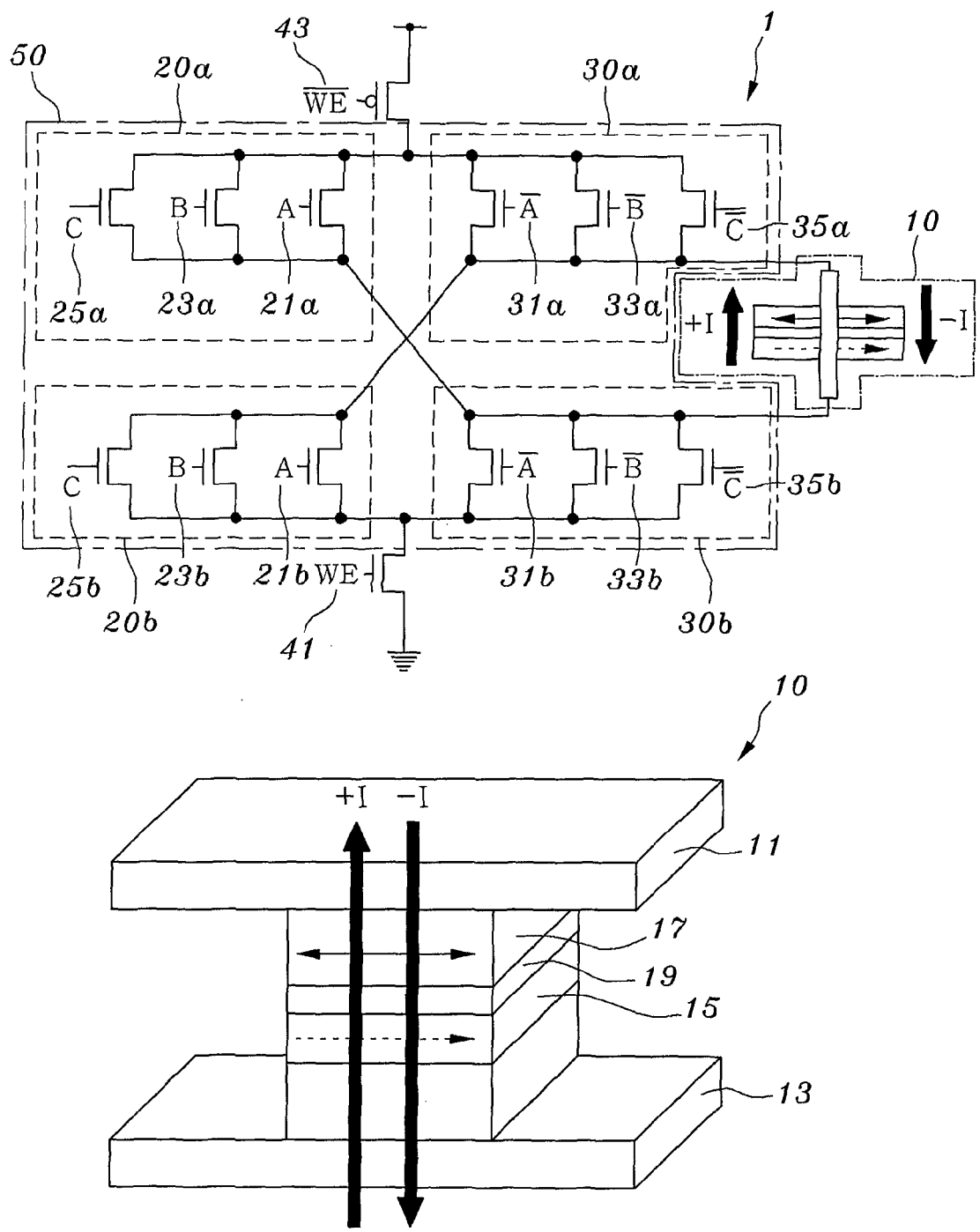
FIG. 11 illustrates a circuit diagram and a partially enlarged diagram showing a logic circuit implemented using the magnetic memory cell according to the present invention.
Figure 12:
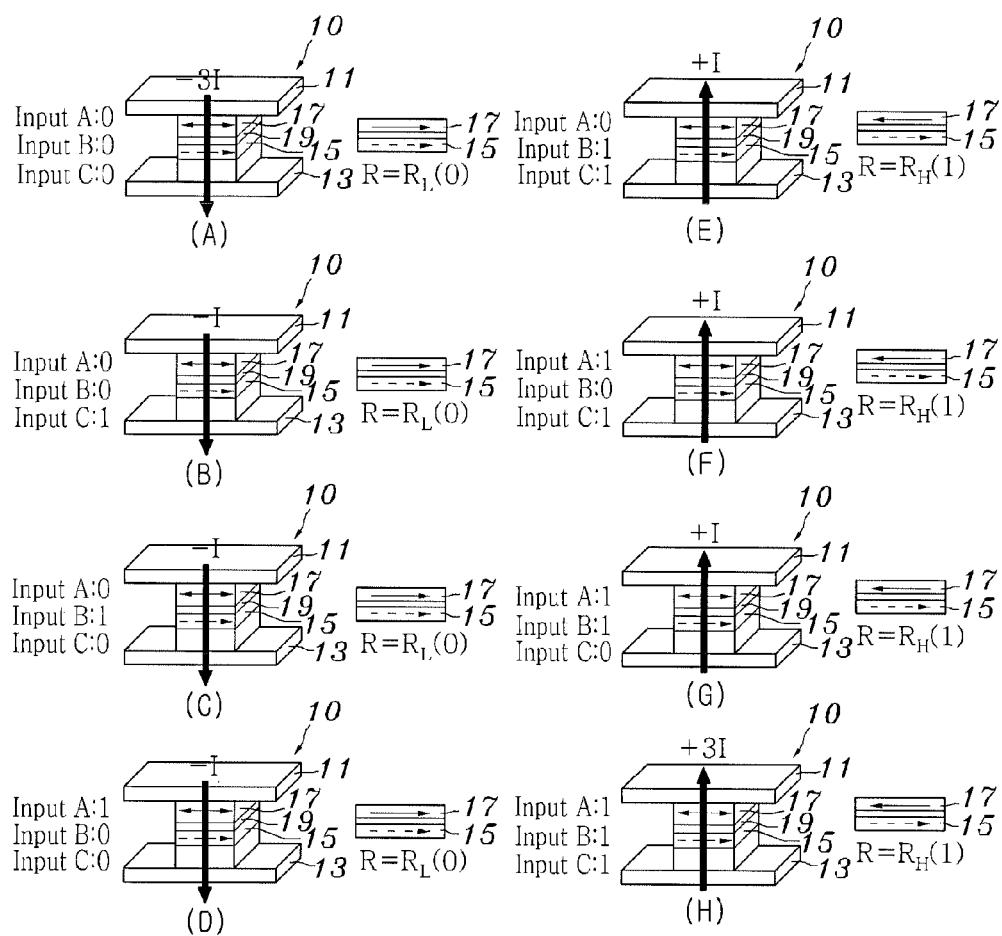
FIG. 12 is a diagram schematically showing the current direction and magnetization direction of an MTJ device based on the operation of the logic circuit of FIG. 11.

FIG. 11 illustrates a circuit diagram and a partially enlarged diagram showing a logic circuit implemented using the magnetic memory cell according to the present invention, and FIG. 12 is a diagram schematically showing the current direction and magnetization direction of an MTJ device based on the operation of the logic circuit of FIG. 11.

As shown in the drawings, a magnetic memory cell 1 according to the present invention has the same construction as that of FIG. 2.

Hereinafter, the operating process of the magnetic memory cell according to this embodiment is described in detail below.

First, certain voltages are applied to the gates WE and $\overline{WE}$ of a first enable MOSFET 41 and a second enable MOSFET 43 so that current flows between the drain and the source of each thereof. Only during a write period in which an operation of writing data into the magnetic memory cell 1 according to the present invention is performed, an input signal having a logic level '1' is applied to the gate WE.

Further, when the direction of current flowing through the MTJ device 10 is a top to bottom direction, that is, the direction from a top electrode 11 to a bottom electrode 13, this current direction is defined as −I. When the direction of current flowing through the MTJ device 10 is a bottom to top direction, that is, the direction from the bottom electrode 13 to the top electrode 11, this current direction is defined as +I.

TABLE 6

| A | B | C | Current | R |
|---|---|---|---------|---|
| 0 | 0 | 0 | −3I | $R_L$(0) |
| 0 | 0 | 1 | −I | $R_L$(0) |
| 0 | 1 | 0 | −I | $R_L$(0) |
| 1 | 0 | 0 | −I | $R_L$(0) |
| 0 | 1 | 1 | +I | $R_H$(1) |
| 1 | 0 | 1 | +I | $R_H$(1) |
| 1 | 1 | 0 | +I | $R_H$(1) |
| 1 | 1 | 1 | +3I | $R_H$(1) |

As shown in Table 6, when it is assumed that a logic input signal applied to each of first MOSFETs 21a and 21b is A, a logic input signal applied to each of second MOSFETs 23a and 23b is B, current applied to each of third MOSFETs 25a and 25b is C, current applied to the MTJ device 10 according to the input signals A, B and C is 'current', and magnetic resistance, generated by controlling a magnetization direction using the current, is R, the operating process of the logic circuit is described below.

The first row of Table 6 corresponds to the case of FIG. 12(a), and, here, the operation performed when '0' is input to A, B and C is described below.

In this case, when a logic level '0' is input to the gates A of the first MOSFETs 21a and 21b of second and fourth current driving units 20a and 20b, a logic level '0' is input to the gates B of the second MOSFETs 23a and 23b, and a logic level '0' is input to the gates C of the third MOSFETs 25a and 25b.

Meanwhile, a logic level '1', which is an inverted signal, is input to the gates $\bar{A}$ of the first MOSFETs 31a and 31b of the first and third current driving units 30a and 30b, and the logic level '1', that is, the inverted signal, is input to the gates $\bar{B}$ of the second MOSFETs 33a and 33b, and the logic level '1', that is, the inverted signal, is input to the gates $\bar{C}$ of the third MOSFETs 35a and 35b.

That is, a voltage corresponding to the logic level '1' is applied to the gates of the first, second and third MOSFETs 31a, 33a and 35a of the first current driving unit 30a, and thus the MOSFETs 31a, 33a and 35a are operated to allow current to flow between the drain and source of each thereof.

Further, when the amount of current output from each MOSFET is assumed to be I, current I is output from each of the sources of the first, second and third MOSFETs 31a, 33a and 35a of the first current driving unit 30a. Since the MOSFETs 31a, 33a and 35a are connected in parallel, a current of 3*I is output.

Further, since the sources of the first, second and third MOSFETs 31a, 33a and 35a of the first current driving unit 30a are connected to the top electrode 11 of the MTJ device 10, current I is applied in a top to bottom direction.

Therefore, since current flowing in the top to bottom direction is defined as −I, and current flowing in the bottom to top direction is defined as +I, a current of −3I is applied to the MTJ device 10, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L=0$).

The second row of Table 6 corresponds to the case of FIG. 12(b), and, here, the operation performed when '0' is input to both A and B, and '1' is input to C is described below.

In this case, a logic level '0' is input to the gates A of the first MOSFETs 21a and 21b of the second and fourth current driving units 20a and 20b, a logic level '0' is input to the gates B of the second MOSFETs 23a and 23b, and a logic '1' is input to the gates C of the third MOSFETs 25a and 25b.

Meanwhile, a logic level '1', which is an inverted signal, is input to the gates $\bar{A}$ of the first MOSFETs 31a and 31b of the first and third current driving units 30a and 30b, the logic level '1', that is, the inverted signal, is input to the gates $\bar{B}$ of the second MOSFETs 33a and 33b, and the logic level '0', that is, the inverted signal, is input to the gates $\bar{C}$ of the third MOSFETs 35a and 35b.

That is, a voltage corresponding to the logic level '1' is applied to the gate of the third MOSFET 25a of the second current driving unit 20a, and the gates of the first and second MOSFETs 31a and 33a of the first current driving unit 30a, and thus current can flow between the drain and source of each of the MOSFETs 25a, 31a and 33a. Further, when the amount of current output from each MOSFET is assumed to be I, current I is output from the source of the third MOSFET 25a of the second current driving unit 20a, and current I is output from each of the sources of the first and second MOSFETs 31a and 33a of the first current driving unit 30a. Since the MOSFETs 31a and 33a are connected in parallel, a current of 2*I is output.

Further, since the source of the third MOSFET 25a of the second current driving unit 20a is connected to the drain of the third current driving unit 30b, and the drain of the third current driving unit 30b is connected to the bottom electrode of the MTJ device 10, current I is applied in a bottom to top direction. Since the sources of the first and second MOSFETs 31a and 33a of the first current driving unit 30a are connected to the top electrode 11 of the MTJ device 10, current 2 I is applied in a top to bottom direction.

Therefore, since current flowing in the top to bottom direction is defined as −I, and current flowing in the bottom to top direction is defined as +I, a current corresponding to I+(−2I)=−I is applied to the MTJ device 10, the magnetization direction of the free layer 17 is changed to a right direction, the magnetization directions of the free layer 17 and the fixed layer 15 are parallel in the same direction, and thus the magnetic resistance of the MTJ device 10 is '0', which is a logic low level ($R_L=0$).

The third row of Table 6 corresponds to the case of FIG. 12(c), and, here, the operation performed when '0' is input to A, '1' is input to B, and '0' is input to C is described below.

In this case, a logic level '0' is input to the gates A of the first MOSFETs 21a and 21b of the second and fourth current driving units 20a and 20b, a logic level '1' is input to the gates B of the second MOSFETs 23a and 23b, and a logic level '0' is input to the gates C of the third MOSFETs 25a and 25b.

Meanwhile, a logic level '1', which is an inverted signal, is input to the gates $\bar{A}$ of the first MOSFETs 31a and 31b of the first and third current driving units 30a and 30b, a logic level '0', that is, the inverted signal, is input to the gates $\bar{B}$ of the second MOSFETs 33a and 33b, and the logic level '1', that is, the inverted signal, is input to the gates $\bar{C}$ of the third MOSFETs 35a and 35b.

That is, a voltage corresponding to the logic level '1' is applied to the gate of the second MOSFET 23a of the second current driving unit 20a and the gates of the first and third MOSFETs 31a and 35a of the first current driving unit 30a, and thus current can flow between the drain and source of each of the MOSFETs 23a, 31a and 35a. Further, when the amount of current output from each MOSFET is assumed to be I, current I is output from the source of the second MOSFET 23a of the second current driving unit 20a, and current I is output from each of the sources of the first and third MOSFETs 31a and 35a of the first current driving unit 30a. Since the MOSFETs 31a and 35a are connected in parallel, a current of 2*I is output.

Further, since the source of the second MOSFET 23a of the second current driving unit 20a is connected to the drain of the third current driving unit 30b, and the drain of the third current driving unit 30b is connected to the bottom electrode of the MTJ device 10, current I is applied in a bottom to top direction. Since the sources of the first and third MOSFETs 31a and 35a of the first current driving unit 30a are connected to the top electrode 11 of the MTJ device 10, current 2I is applied in a top to bottom direction.

Therefore, since current flowing in the top to bottom direction is defined as −I, and current flowing in the bottom to top direction is defined as +I, a current corresponding to I+(−2I)=−I is applied to the MTJ device 10, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The fourth row of Table 6 corresponds to the case of FIG. 12(d), and, here, the operation performed when '1' is input to A, '0' is input to B, and '0' is input to C is described below.

In this case, a logic level '1' is input to the gates A of the first MOSFETs 21a and 21b of the second and fourth current driving units 20a and 20b, a logic level '0' is input to the gates B of the second MOSFETs 23a and 23b, and a logic level '0' is input to the gates C of the third MOSFETs 25a and 25b.

Meanwhile, a logic level '0', which is an inverted signal, is input to the gates $\bar{A}$ of the first MOSFETs 31a and 31b of the first and third current driving units 30a and 30b, a logic level '1', that is, the inverted signal, is input to the gates $\bar{B}$ of the second MOSFETs 33a and 33b, and a logic level '1', which is the inverted signal, is input to the gates $\bar{C}$ of the third MOSFETs 35a and 35b.

That is, a voltage corresponding to the logic level '1' is applied to the gate of the first MOSFET 21a of the second current driving unit 20a, and the gates of the second and third MOSFETs 33a and 35a of the first current driving unit 30a, and thus current can flow between the drain and source of each of the MOSFETs 21a, 33a and 35a.

Further, when the amount of current output from each MOSFET is assumed to be I, current I is output from the source of the second MOSFET 23a of the second current driving unit 20a, and a current of 2*I is output from the sources of the second and third MOSFETs 33a and 35a of the first current driving unit 30a.

Further, since the source of the second MOSFET 23a of the second current driving unit 20a is connected to the drain of the third current driving unit 30b, and the drain of the third current driving unit 30b is connected to the bottom electrode of the MTJ device 10, current I is applied in a bottom to top direction. Since the sources of the second and third MOSFETs 33a and 35a of the first current driving unit 30a are connected to the top electrode 11 of the MTJ device 10, current 2I is applied in a top to bottom direction.

Therefore, since current flowing in the top to bottom direction is defined as −I, and current flowing in the bottom to top direction is defined as +I, a current corresponding to I+(−2I)=−I is applied to the MTJ device 10, the magnetization direction of the free layer 17 is changed to a right direction, and the magnetization directions of the free layer 17 and the fixed layer 15 are parallel in the same direction, and thus the magnetic resistance of the MTJ device 10 is '0', which is a logic low level ($R_L$=0).

The fifth row of Table 6 corresponds to the case of FIG. 12(e), and, here, the operation performed when '0' is input to A, '1' is input to B, and '1' is input to C is described below.

Since a logic level '0' is input to the gates of the first MOSFETs 21a and 21b of the second and fourth current driving units 20a and 20b, a logic level '1' is input to the gates B of the second MOSFETs 23a and 23b, and a logic level '1' is input to the gates C of the third MOSFETs 25a and 25b.

Meanwhile, a logic level '1', which is an inverted signal, is input to the gates $\bar{A}$ of the first MOSFETs 31a and 31b of the first and third current driving units 30a and 30b, a logic level '0', which is the inverted signal, is input to the gates $\bar{B}$ of the second MOSFETs 33a and 33b, and a logic level '0', which is the inverted signal, is input to the gates $\bar{C}$ of the third MOSFETs 35a and 35b. That is, a voltage corresponding to the logic level '1' is applied to the gates of the second and third MOSFETs 23a and 25a of the second current driving unit 20a, and the gate of the first MOSFET 31a of the first current driving unit 30a, and thus current can flow between the drain and source of each of the MOSFETs 23a, 25a and 31a.

Further, when the amount of current output from each MOSFET is assumed to be I, a current of 2*I is output from the sources of the second and third MOSFETs 23a and 25a of the second current driving unit 20a, and current I is output from the source of the first MOSFET 31a of the first current driving unit 30a.

Further, since the sources of the second and third MOSFETs 23a and 25a of the second current driving unit 20a is connected to the drain of the third current driving unit 30b, and the drain of the third current driving unit 30b is connected to the bottom electrode of the MTJ device 10, current 2I is applied in a bottom to top direction. Since the source of the first MOSFET 31a of the first current driving unit 30a is connected to the top electrode 11 of the MTJ device 10, the current I is applied in a top to bottom direction.

Therefore, since current flowing in the top to bottom direction is defined as −I, and current flowing in the bottom to top direction is defined as +I, a current corresponding to 2I+(−I)=I is applied to the MTJ device 10, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

The sixth row of Table 6 corresponds to the case of FIG. 12(f), and, here, the operation performed when '1' is input to A, '0' is input to B, and '1' is input to C is described below.

In this case, a logic level '1' is input to the gates A of the first MOSFETs 21a and 21b of the second and fourth current driving units 20a and 20b, a logic level '0' is input to the gates B of the second MOSFETs 23a and 23b, and a logic level '1' is input to the gates C of the third MOSFETs 25a and 25b.

Meanwhile, a logic level '0', which is an inverted signal, is input to the gates $\bar{A}$ of the first MOSFETs 31a and 31b of the first and third current driving units 30a and 30b, a logic level '1', that is, the inverted signal, is input to the gates $\bar{B}$ of the second MOSFETs 33a and 33b, and a logic level '0', that is, the inverted signal, is input to the gates $\bar{C}$ of the third MOSFETs 35a and 35b. That is, a voltage corresponding to the logic level '1' is applied to the gates of the first and third MOSFETs 21a and 25a of the second current driving unit 20a, and the gate of the second MOSFET 33a of the first current driving unit 30a, and thus current can flow between the drain and source of each of the MOSFETs 21a, 25a and 33a. Further, when the amount of current output from each MOSFET is assumed to be I, a current of 2*I is output from the sources of the first and third MOSFETs 21a and 25a of the second current driving unit 20a, and current I is output from the source of the second MOSFET 33a of the first current driving unit 30a.

Further, since the sources of the first and third MOSFETs 21a and 25a of the second current driving unit 20a are connected to the drain of the third current driving unit 30b, and the drain of the third current driving unit 30b is connected to the bottom electrode of the MTJ device 10, current 2I is applied in a bottom to top direction. Since the source of the second MOSFET 33a of the first current driving unit 30a is connected to the top electrode 11 of the MTJ device 10, current I is applied in a top to bottom direction.

Therefore, since current flowing in the top to bottom direction is defined as −I, and current flowing in the bottom to top direction is defined as +I, a current corresponding to 2I+(−I)=I is applied to the MTJ device 10, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

The seventh row of Table 6 corresponds to the case of FIG. 12(g), and, here, the operation performed when '1' is input to A, '1' is input to B, and '0' is input to C is described below.

In this case, a logic level '1' is input to the gates A of the first MOSFETs 21a and 21b of the second and fourth current driving units 20a and 20b, a logic level '1' is input to the gates B of the second MOSFETs 23a and 23b, and a logic level '0' is input to the gates C of the third MOSFETs 25a and 25b.

Meanwhile, a logic level '0', which is an inverted signal, is input to the gates $\bar{A}$ of the first MOSFETs 31a and 31b of the first and third current driving units 30a and 30b, a logic level '0', that is, the inverted signal, is input to the gates $\bar{A}$ of the second MOSFETs 33a and 33b, and a logic level '1', that is, the inverted signal, is input to the gates $\bar{C}$ of the third MOSFETs 35a and 35b. That is, a voltage corresponding to the logic level '1' is applied to the gates of the first and second MOSFETs 21a and 23a of the second current driving unit 20a, and the gate of the third MOSFET 35a of the first current driving unit 30a, and thus current can flow between the drain and source of each of the MOSFETs 21a, 23a and 35a. Further, when the amount of current output from each MOSFET is assumed to be I, a current of 2*I is output from the sources of the first and second MOSFETs 21a and 23a of the second current driving unit 20a, and current I is output from the source of the third MOSFET 35a of the first current driving unit 30a.

Further, since the sources of the first and second MOSFETs 21a and 23a of the second current driving unit 20a are connected to the drain of the third current driving unit 30b, and the drain of the third current driving unit 30b is connected to the bottom electrode of the MTJ device 10, current 2I is applied in a bottom to top direction. Since the source of the third MOSFET 35a of the first current driving unit 30a is connected to the top electrode 11 of the MTJ device 10, current I is applied in a top to bottom direction.

Therefore, since current flowing in the top to bottom direction is defined as −I, and current flowing in the bottom to top direction is defined as +I, a current corresponding to 2I+(−I)=I is applied to the MTJ device 10, the magnetization direction of the free layer 17 is changed to a left direction, the magnetization directions of the free layer 17 and the fixed layer 15 are anti-parallel, and thus the magnetic resistance of the MTJ device 10 is '1', which is a logic high level ($R_H$=1).

The eighth row of Table 6 corresponds to the case of FIG. 12(h) and, here, the operation performed when '1' is input to all of A, B and C is described below.

In this case, a logic level '1' is input to the gates A of the first MOSFETs 21a and 21b of the second and fourth current driving units 20a and 20b, a logic level '1' is input to the gates B of the second MOSFETs 23a and 23b, and a logic level '1' is input to the gates C of the third MOSFETs 25a and 25b.

Meanwhile, a logic level '0', which is an inverted signal, is input to the gates $\bar{A}$ of the first MOSFETs 31a and 31b of the first and third current driving units 30a and 30b, a logic level '0', that is, the inverted signal, is input to the gates $\bar{B}$ of the second MOSFETs 33a and 33b, and a logic level '0', that is, the inverted signal, is input to the gates $\bar{C}$ of the third MOSFETs 35a and 35b.

That is, a voltage corresponding to the logic level '1' is applied to the gates of the first, second and third MOSFETs 21a, 23a and 25a of the second current driving unit 20a, and thus current can flow between each of the MOSFETs 21a, 23a and 25a.

Further, when the amount of current output from each MOSFET is assumed to be I, a current of 3*I is output from the sources of the first, second and third MOSFETs 21a, 23a and 25a of the second current driving unit 20a. Further, since the sources of the first, second and third MOSFETs 21a, 23a and 25a of the second current driving unit 20a are connected to the drain of the third current driving unit 30b, and the drain of the third current driving unit 30b is connected to the bottom electrode of the MTJ device 10, the current 3I is applied in a bottom to top direction.

Therefore, since current flowing in the top to bottom direction is defined as −I and current flowing in the bottom to top direction is defined as +I, the current 3I is applied to the MTJ device 10, the magnetization direction of the free layer 17 is changed to a left direction, and the magnetization directions of the free layer 17 and the fixed layer 15 are anti-parallel, and thus the magnetic resistance of the MTJ device 10 is '1', which is a logic high level ($R_H$=1).

That is, the logic circuit according to the present embodiment is implemented to perform a logic operation given in the following Equation 6.

$$R = A \cdot B + B \cdot C + C \cdot A \qquad \text{[Equation 6]}$$

Although the preferred embodiments of the present invention have been disclosed for illustrative purposes, those skilled in the art will appreciate that the scope of the present invention is not limited to these specific embodiments, and various modifications are possible, without departing from the scope and spirit of the invention as disclosed in the accompanying claims.

Industrial Applicability

As described above, the present invention has industrial advantages in that additional metal input layers are eliminated from the structure of a magnetic memory cell, so that the structure of the magnetic memory cell is simplified, thus enabling magnetic memory cells to be more efficiently manufactured and at lower costs.

The invention claimed is:

1. A magnetic memory cell, comprising:
  a Magnetic Tunnel Junction (MTJ) device including top and bottom electrodes, which are provided to allow current to flow therethrough, and a fixed layer and a free layer, which are magnetic layers respectively deposited on a top and a bottom of an insulating layer, required to insulate the top and bottom electrodes from each other; and
  a current control unit including a first current driving unit, one end of which is connected to the top electrode, a second current driving unit, one end of which is connected to the other end of the first current driving unit, a third current driving unit, one end of which is connected to the bottom electrode, and a fourth current driving unit, one end of which is connected to the other end of the third current driving unit, wherein the current control unit is directly connected to the top and bottom electrodes and changes the magnetization direction of the free layer by applying current in a direction crossing the top and bottom electrodes, wherein the current control unit is configured to perform a logic function, in which the MTJ device is operated, by adjusting a magnitude of current flowing through the MTJ device, wherein the current control unit controls a direction of current crossing between the top and bottom electrodes, and changes the magnetization direction of the free layer according to the direction of current crossing between the top and bottom electrodes, wherein the current driving unit is turned on or off in response to an input logic level, and thus the magnitude of the current flowing through the MTJ device is adjusted, wherein the current control unit comprises inputs corresponding to a logic level required to adjust a write operation, a logic level required to determine a type of operating logic circuit, and two logic levels required for a logic operation, wherein the first current driving unit includes a plurality of Metal Oxide Semiconductor Field Effect Transistors (MOSFETs) and sources of the plurality of MOSFETs are directly connected to the top electrode, and wherein the third current driving unit includes a plurality of MOSFETs and drains of the plurality of MOSFETs are directly connected to the bottom electrode.

2. The magnetic memory cell according to claim 1, wherein the current driving unit comprises three MOSFETs, which receives a logic level to determine a logic function that the current control unit is configured to perform, and a logic level, required for a logic operation.

3. The magnetic memory cell according to claim 2, wherein the current driving units comprise two current driving units, to which a logic level to determine a logic function that the current control circuit is configured to perform and a logic level required for a logic operation are applied, and two current driving units, to which signals, obtained by inverting the logic levels, are applied.

4. The magnetic memory cell according to claim 1, wherein each of the first to fourth current driving units includes three MOSFETs connected in parallel with each other.

5. The magnetic memory cell according to claim 4, wherein the one end of the first current driving unit is connected to the other end of the fourth current driving unit, and the other end of the second current driving unit is connected to the one end of the third current driving unit.

6. The magnetic memory cell according to claim 1, wherein the current control circuit comprises:
a first enable MOSFET, a first end of which is connected to a node to which the first current driving unit and the second current driving unit are connected; and
a second enable MOSFET, a first end of which is connected to a node to which the third current driving unit and the fourth current driving unit are connected.

7. The magnetic memory cell according to claim 1, wherein each of the current driving unit comprises:
a first MOSFET having a gate to which a first logic input signal is applied;
a second MOSFET having a gate to which a second logic input signal is applied; and
a third MOSFET having a gate to which a third logic input signal is applied.

8. The magnetic memory cell according to claim 7, wherein signals applied to respective gates of the MOSFETs, constituting the first current driving unit, are identical to signals applied to respective gates of the MOSFETs, constituting the third current driving unit, and signals applied to respective gates of the MOSFETs, constituting the second current driving unit, are identical to respective gates of the MOSFETs, constituting the fourth current driving unit, but the signals applied to the first current driving unit and the second current driving unit have an inverted relationship with each other.

9. The magnetic memory cell according to claim 8, wherein the Magnetic Tunnel Junction (MTJ) device is operated as one of an AND circuit, an OR circuit, a NAND circuit and a NOR circuit according to the third logic input signal applied to the gate of a third MOSFET, constituting each of the current driving units.

10. The magnetic memory cell according to claim 9, wherein the Magnetic Tunnel Junction (MTJ) device is operated as the AND circuit according to logic levels of the first logic input signal and the second logic input signal when a logic level of the third logic input signal applied to the first current driving unit is '1'.

11. The magnetic memory cell according to claim 9, wherein the Magnetic Tunnel Junction (MTJ) device is operated as the OR circuit according to logic levels of the first logic input signal and the second logic input signal when a logic level of the third logic input signal applied to the first current driving unit is '0'.

12. The magnetic memory cell according to claim 9, wherein the Magnetic Tunnel Junction (MTJ) device is operated as the NAND circuit according to logic levels of the first logic input signal and the second logic input signal when signals applied to gates of respective MOSFETs of the first current driving unit are non-inverted signals, and a logic level of the third logic input signal applied to the first current driving unit is '0 '.

13. The magnetic memory cell according to claim 9, wherein the Magnetic Tunnel Junction (MTJ) device is operated as the NOR circuit according to logic levels of the first logic input signal and the second logic input signal when signals applied to gates of respective MOSFETs of the first current driving unit are non-inverted signals, and a logic level of the third logic input signal applied to the first current driving unit is '1'.

* * * * *